(12) United States Patent
Kim et al.

(10) Patent No.: US 12,156,427 B2
(45) Date of Patent: Nov. 26, 2024

(54) DISPLAY DEVICE

(71) Applicant: LG Display Co., Ltd., Seoul (KR)

(72) Inventors: MoonSoo Kim, Paju-si (KR); DoYoung Kum, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 400 days.

(21) Appl. No.: 17/555,748

(22) Filed: Dec. 20, 2021

(65) Prior Publication Data

US 2022/0208916 A1 Jun. 30, 2022

(30) Foreign Application Priority Data

Dec. 24, 2020 (KR) .................... 10-2020-0183544

(51) Int. Cl.
*H10K 59/121* (2023.01)
*H10K 59/122* (2023.01)
*H10K 59/131* (2023.01)
*H10K 59/35* (2023.01)

(52) U.S. Cl.
CPC ....... *H10K 59/1213* (2023.02); *H10K 59/122* (2023.02); *H10K 59/131* (2023.02); *H10K 59/351* (2023.02); *H10K 59/353* (2023.02)

(58) Field of Classification Search
None
See application file for complete search history.

(56) References Cited

U.S. PATENT DOCUMENTS

| | | | | |
|---|---|---|---|---|
| 2014/0312323 | A1* | 10/2014 | Park | H10K 59/80522 438/23 |
| 2016/0351638 | A1* | 12/2016 | Im | H10K 59/80522 |
| 2021/0183964 | A1* | 6/2021 | Jang | H10K 59/352 |
| 2021/0202674 | A1* | 7/2021 | Jo | H10K 59/131 |
| 2022/0181391 | A1* | 6/2022 | Park | H10K 59/878 |
| 2022/0181396 | A1* | 6/2022 | Choi | H10K 59/121 |

FOREIGN PATENT DOCUMENTS

KR 10-2017-0014206 A 2/2017

\* cited by examiner

*Primary Examiner* — Alexander G Ghyka
(74) *Attorney, Agent, or Firm* — SEED IP LAW GROUP LLP

(57) ABSTRACT

A display device may improve an aperture ratio. The display device comprises a substrate provided with transmissive areas and a plurality of subpixels disposed between the transmissive areas, a driving transistor provided in each of the plurality of subpixels, an anode electrode provided in each of the plurality of subpixels and coupled with the driving transistor through an anode contact hole, a bank overlapped with at least a portion of the anode contact hole over the anode electrode, a light emitting layer provided over the anode electrode and the bank, and a cathode electrode provided over the light emitting layer. An end of at least one side of the anode electrode is exposed without being covered by the bank.

12 Claims, 10 Drawing Sheets

DISPLAY DEVICE

BACKGROUND

Technical Field

The present disclosure relates to a display device.

Description of the Related Art

With advancement in information-oriented societies, demands for display devices that display an image have increased in various forms. Recently, various types of display devices such as a liquid crystal display (LCD) device, a plasma display panel (PDP) device, and an organic light emitting display (OLED) device, a quantum dot light emitting display (QLED) device have been widely utilized.

Recently, studies for transparent display devices for allowing a user to look at objects or image arranged on an opposite side of a display device after transmitting the display device are actively ongoing.

A transparent display device includes a display area on which an image is displayed, and a non-display area, wherein the display area may include a transmissive area that may transmit light, and a non-transmissive area. The transparent display device may have high light transmittance in the display area through the transmissive area.

BRIEF SUMMARY

A transparent display device may improve transparency by increasing a transmissive area. However, the inventors of the present disclosure have appreciated that when the transmissive area is increased, a non-transmissive area is reduced. The inventors have recognized that some transparent display devices in the related art suffers from the technical problem of luminance being more deteriorated than a general display device (e.g., a non-transparent display device) as a light emission area is disposed in a non-transmissive area having a narrow size.

One or more embodiments of the present disclosure has been made in view of various technical problems including the above problems, and various embodiments of the present disclosure provide a display device that may improve an aperture ratio.

In addition to the technical benefits of the present disclosure as mentioned above, additional technical benefits and features of the present disclosure will be clearly understood by those skilled in the art from the following description of the present disclosure.

In accordance with an aspect of the present disclosure, the above and other technical benefits can be accomplished by the provision of a display device comprising a substrate provided with transmissive areas and a plurality of subpixels disposed between the transmissive areas, a driving transistor provided in each of the plurality of subpixels, an anode electrode provided in each of the plurality of subpixels and coupled with the driving transistor through an anode contact hole, a bank overlapped with at least a portion of the anode contact hole on the anode electrode, a light emitting layer provided on the anode electrode and the bank, and a cathode electrode provided on the light emitting layer. An end of at least one side of the anode electrode is exposed without being covered by the bank.

In accordance with another aspect of the present disclosure, the above and other technical benefits can be accomplished by the provision of a display device comprising a substrate provided with transmissive areas and a plurality of subpixels disposed between the transmissive areas, a driving transistor including an active layer, a gate electrode, a source electrode and a drain electrode, an anode electrode provided in each of the plurality of subpixels and coupled with a source electrode or a drain electrode of the driving transistor through an anode contact hole, a bank covering at least one anode contact hole on the anode electrode with an island pattern, a light emitting layer provided on the anode electrode and the bank, and a cathode electrode disposed on the light emitting layer.

In accordance with other aspect of the present disclosure, the above and other technical benefits can be accomplished by the provision of a display device comprising a substrate provided with a display area including transmissive areas and a plurality of subpixels disposed between the transmissive areas and a non-display area disposed on at least one side of the display area, an anode electrode provided in each of the plurality of subpixels, and a bank disposed in the display area in a grid shape while exposing at least one side of the anode electrode.

BRIEF DESCRIPTION OF THE SEVERAL VIEWS OF THE DRAWINGS

The above and other features and other advantages of the present disclosure will be more clearly understood from the following detailed description taken in conjunction with the accompanying drawings, in which.

DETAILED DESCRIPTION

Figure 1:
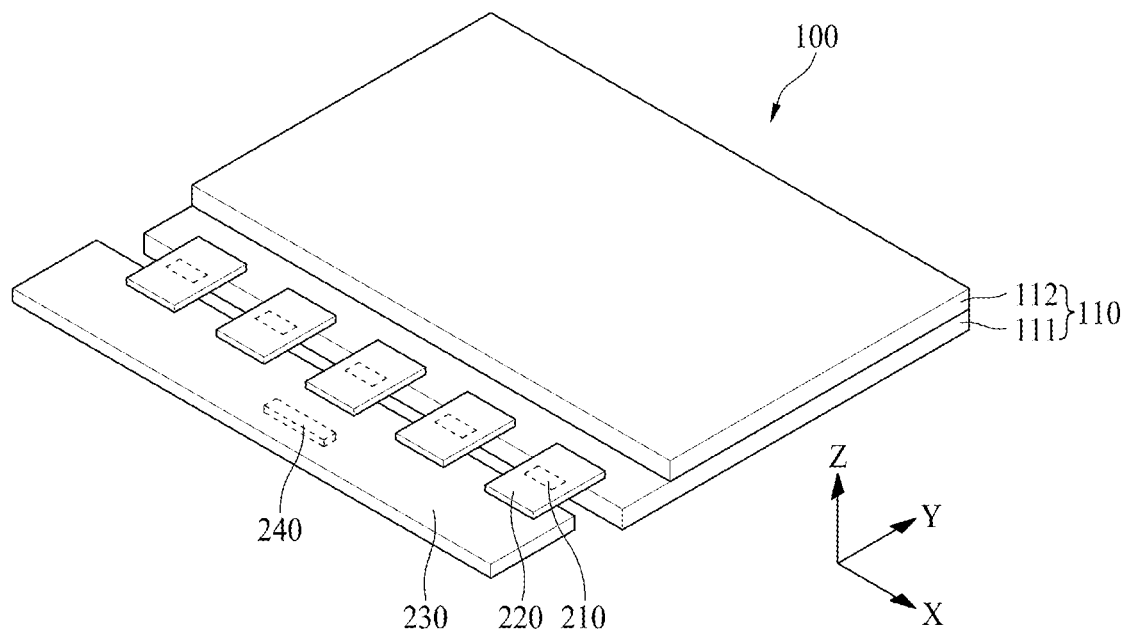
FIG. 1 is a perspective view illustrating a display device according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a case where 'comprise,' 'have,' and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~,' 'above~,' 'below~,' and 'next to~,' one or more portions may be arranged between two other portions unless 'just' or 'direct' is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first," "second," etc., may be used. These terms are intended to identify the corresponding elements from the other elements, and basis, order, or number of the corresponding elements are not limited by these terms. The expression that an element is "connected" or "coupled" to another element should be understood that the element may directly be connected or coupled to another element but may directly be connected or coupled to another element unless specially mentioned, or a third element may be interposed between the corresponding elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, an example of a display device according to the present disclosure will be described in detail with reference to the accompanying drawings. Wherever possible, the same reference numbers will be used throughout the drawings to refer to the same or like parts.

FIG. 1 is a perspective view illustrating a display device according to one embodiment of the present disclosure.

Hereinafter, X axis indicates a line parallel with a scan line, Y axis indicates a line parallel with a data line, and Z axis indicates a height direction of a display device 100.

Although a description has been described based on that the display device 100 according to one embodiment of the present disclosure is embodied as an organic light emitting display device, the display device 100 may be embodied as a liquid crystal display device, a plasma display panel (PDP), a Quantum dot Light Emitting Display (QLED) or an Electrophoresis display device.

Referring to FIG. 1, the display device 100 according to one embodiment of the present disclosure includes a display panel 110, a source drive integrated circuit (IC) 210, a flexible film 220, a circuit board 230, and a timing controller 240.

The display panel 110 includes a first substrate 111 and a second substrate 112, which face each other. The second substrate 112 may be an encapsulation substrate. The first substrate 111 may be a plastic film, a glass substrate, or a silicon wafer substrate formed using a semiconductor process. The second substrate 112 may be a plastic film, a glass substrate, or an encapsulation film. The first substrate 111 and the second substrate 112 may be made of a transparent material.

The scan driver may be provided in one side of the display area of the display panel 110, or the non-display area of both peripheral sides of the display panel 110 by a gate driver in panel (GIP) method. In another way, the scan driver may be manufactured in a driving chip, may be mounted on the flexible film, and may be attached to one peripheral side or both peripheral sides of the display area of the display panel 110 by a tape automated bonding (TAB) method.

If the source drive IC 210 is manufactured in a driving chip, the source drive IC 210 may be mounted on the flexible film 220 by a chip on film (COF) method or a chip on plastic (COP) method.

Pads, such as power pads and data pads, may be provided in the pad area PA of the display panel 110. Lines connecting the pads with the source drive IC 210 and lines connecting the pads with lines of the circuit board 230 may be provided in the flexible film 220. The flexible film 220 may be attached onto the pads using an anisotropic conducting film, whereby the pads may be connected with the lines of the flexible film 220.

Figure 2:
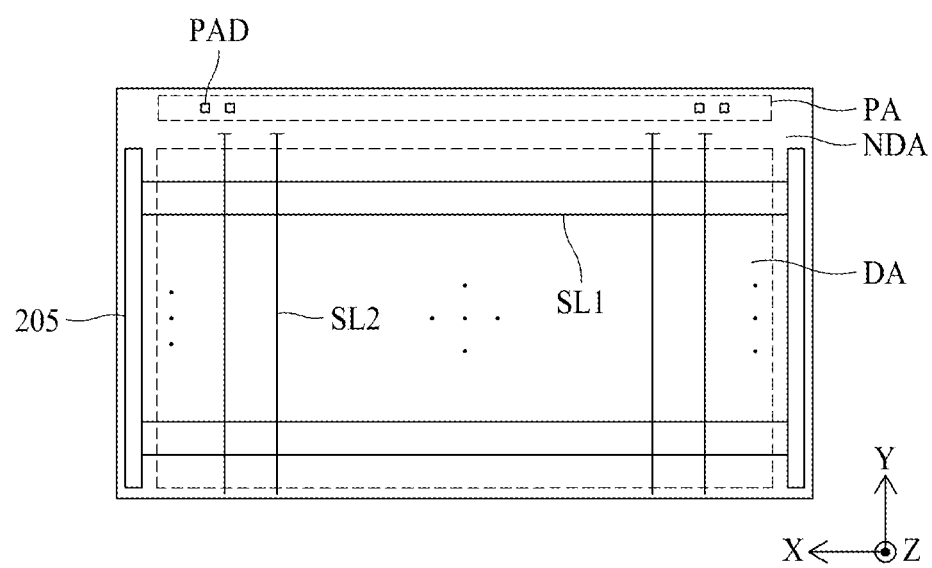
FIG. 2 is a schematic plane view illustrating a transparent display panel according to one embodiment of the present disclosure.
Figure 3:
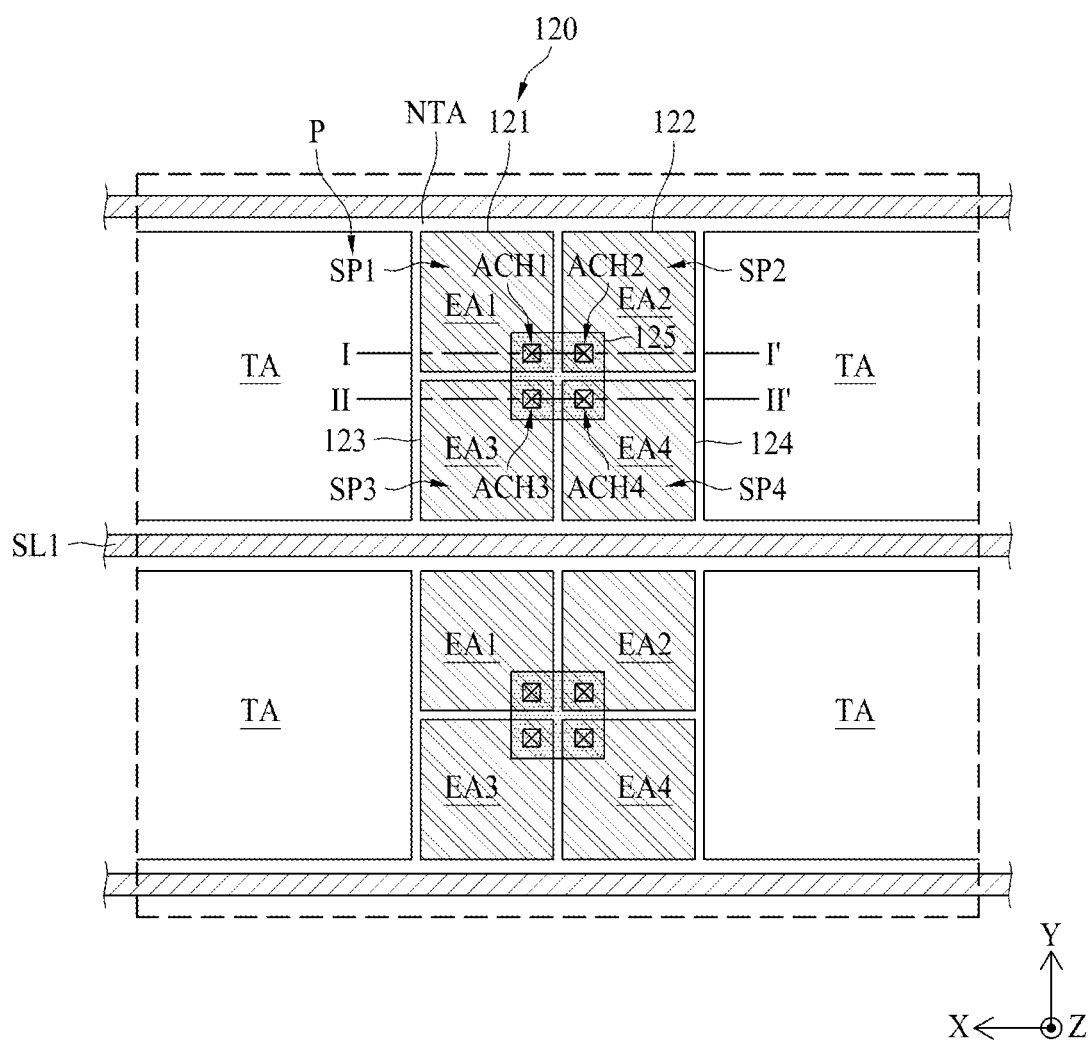
FIG. 3 is a view illustrating an example of a pixel provided in a transparent display panel.
Figure 4:
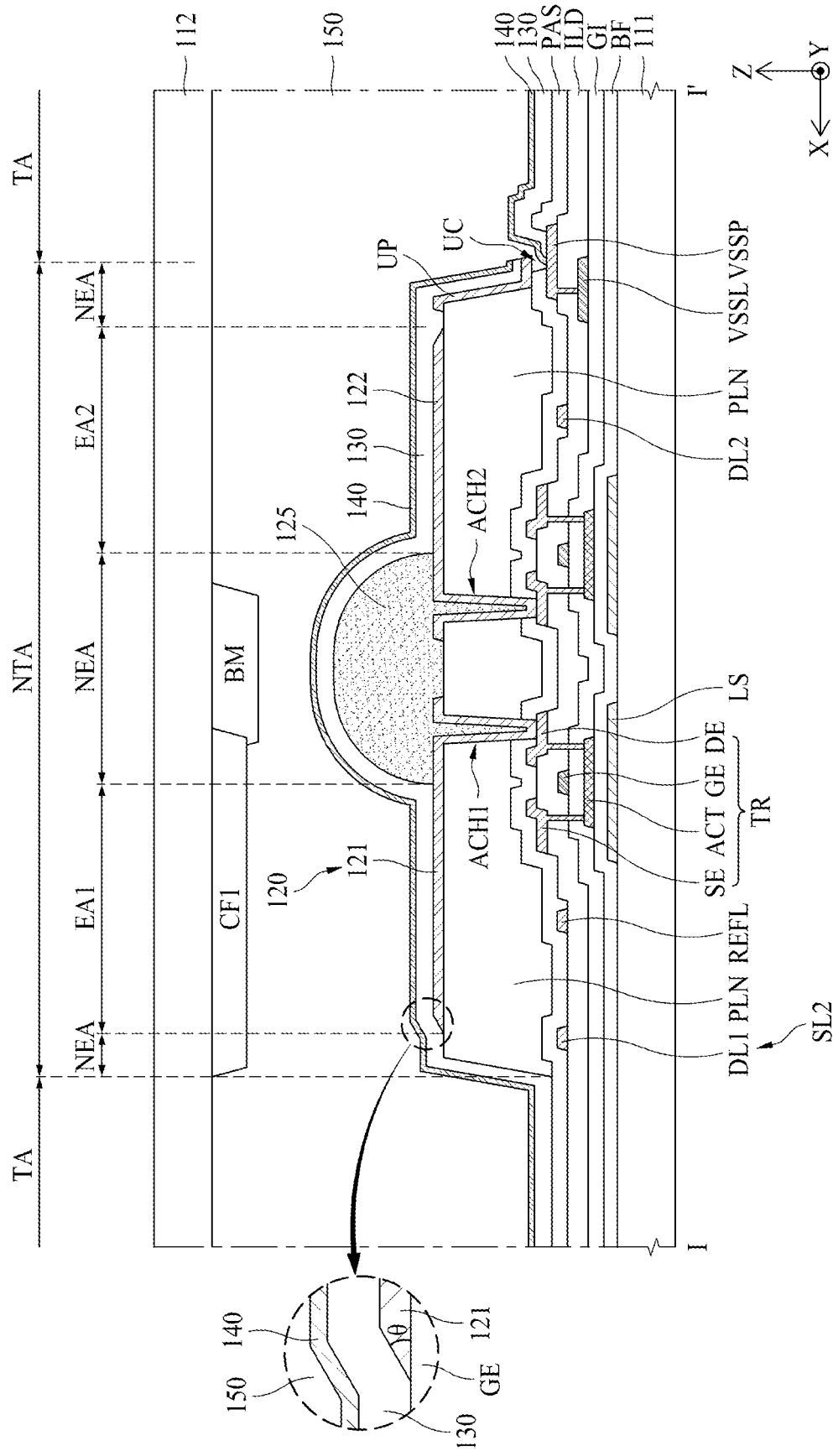
FIG. 4 is a cross-sectional view taken along line I-I' of FIG. 3.
Figure 5:
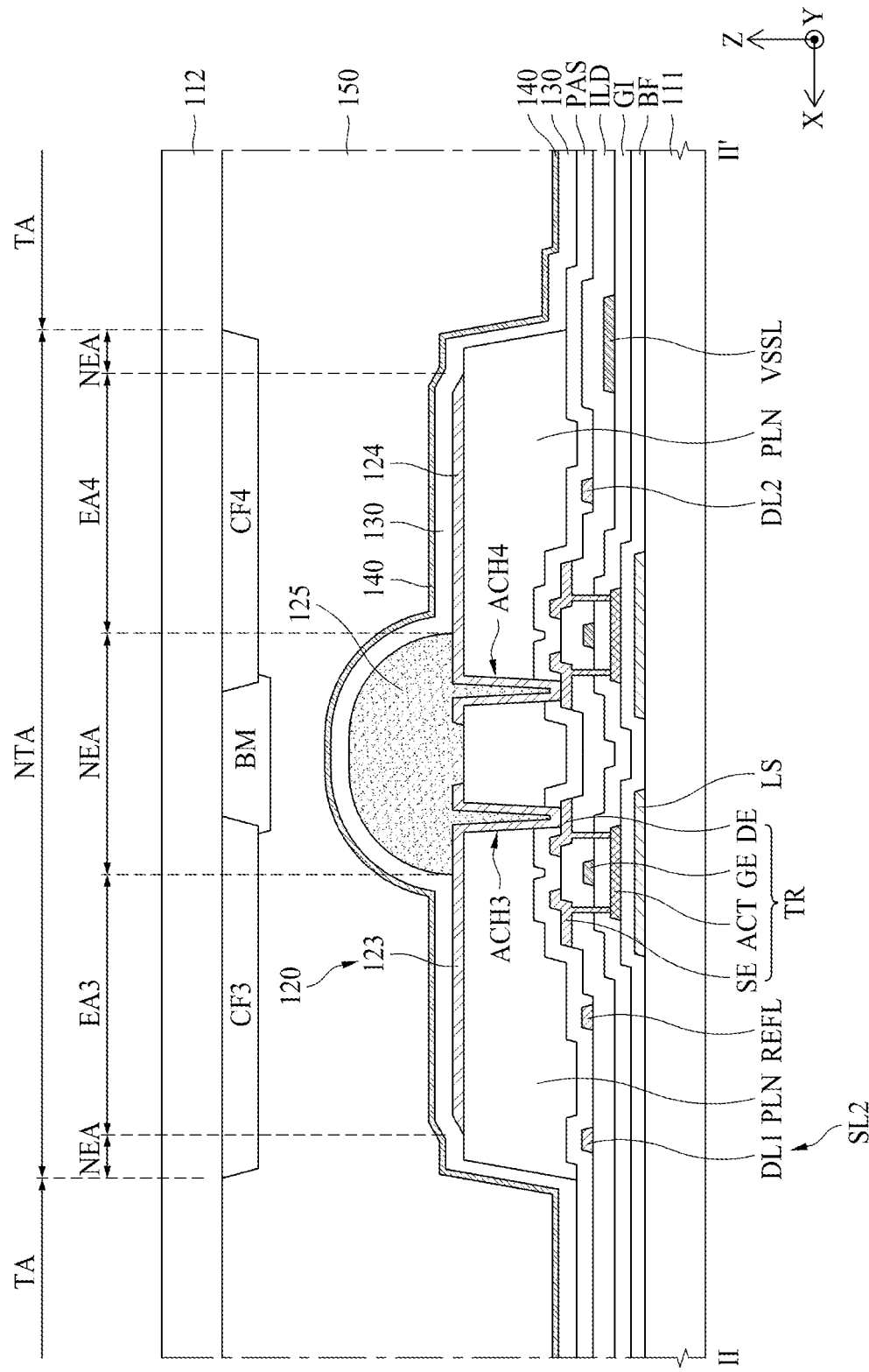
FIG. 5 is a cross-sectional view taken along line II-IF of FIG. 3.

FIG. 2 is a schematic plane view illustrating a transparent display panel according to one embodiment of the present disclosure, FIG. 3 is a view illustrating an example of a pixel provided in a transparent display panel, FIG. 4 is a cross-sectional view taken along line I-I' of FIG. 3, and FIG. 5 is a cross-sectional view taken along line II-IP of FIG. 3.

In the following description, although the display panel 110 is embodied as a transparent display panel, the display panel 110 may be embodied as a general display panel in which a transmissive area TA is not provided.

Referring to FIG. 2 and FIG. 5, the first substrate 111 may include a display area DA provided with pixels P to display an image, and a non-display area NDA for not displaying an image.

The non-display area NDA may be provided with a pad area PA in which pads PAD are disposed, and at least one scan driver 205.

The scan driver 205 are connected to the scan lines SL and supplies scan signals to the scan lines SL. The scan driver 205 may be disposed in one side of the display area DA of the display panel 110, or the non-display area NDA of both peripheral sides of the display panel 110 by a gate driver in panel (GIP) method. For example, as shown in FIG. 2, the scan driver 205 may be provided in both side of the display area DA of the display panel 110, but these scan drivers are not limited thereto. The scan driver 205 may be provided only in one side of the display area DA of the display panel 110.

The display area DA, as shown in FIG. 3, includes a transmissive area TA and a non-transmissive area NTA. The transmissive area TA is an area through which most of externally incident light passes, and the non-transmissive area NTA is an area through which most of externally incident light fails to transmit. For example, the transmissive area TA may be an area where light transmittance is greater than $\alpha$ %, for example, about 90%, and the non-transmissive area NTA may be an area where light transmittance is smaller than $\beta$ %, for example, about 50%. At this time, $\alpha$ is greater than β. A user may view an object or background arranged over a rear surface of the display panel 110 due to the transmissive area TA.

The non-transmissive area NTA may include a plurality of pixels P, and a plurality of first and second signal lines SL1 and SL2 for supplying signals to the plurality of pixels P, respectively.

The plurality of first signal lines SL1 may be extended in a first direction (e.g., X-axis direction). The plurality of first signal lines SL1 may cross the plurality of second signal lines SL2. Each of the plurality of first signal lines SL1 may include at least one scan line SCANL.

Hereinafter, when the first signal line SL1 includes a plurality of lines, the first signal line SL1 may refer to a signal line group including a plurality of lines. For example, one first signal line SL1 may refer to a signal line group including two scan lines SCANL.

The plurality of second signal lines SL2 may be extended in a second direction (e.g., Y-axis direction). Each of the plurality of second signal lines SL2 may include at least one of the data lines DL1 and DL2, a reference line REFL and a common power line VSSL. Each of the plurality of second signal lines SL2 may further include a pixel power line (not shown).

Hereinafter, when the second signal line SL2 includes a plurality of lines, the second signal line SL2 may refer to a signal line group including a plurality of lines. For example, one second signal line SL2, as shown in FIGS. 4 and 5, may refer to a signal line group including two data lines DL1 and DL2, a reference line REFL and a common power line VSSL.

A transmissive area TA may be disposed between the first signal lines SL1 adjacent to each other. In addition, the transmissive area TA may be disposed between the second signal lines SL2 adjacent to each other. As a result, the transmissive area TA may be surrounded by two first signal lines SL1 and two second signal lines SL2.

Pixels P may be provided to overlap at least one of the first signal line SL1 and the second signal line SL2, thereby emitting predetermined light to display an image. An emission area EA may correspond to an area, from which light is emitted, in the pixel P.

Each of the pixels P may include at least one of a first subpixel P1, a second subpixel P2, a third subpixel P3 and a fourth subpixel P4. The first subpixel P1 may include a first emission area EA1 emitting light of a red color. The second subpixel P2 may include a second emission area EA2 emitting light of a white color. The third subpixel P3 may include a third emission area EA3 emitting light of a blue color. The fourth subpixel P4 may include a fourth emission area EA4 emitting light of a green color. However, the emission areas are not limited to this example. Each of the pixels P may further include a subpixel emitting light of a color other than red, green, blue and white. Also, the arrangement order of the subpixels P1, P2, P3 and P4 may be changed in various ways.

Hereinafter, for convenience of description, the description will be given based on that a first subpixel P1 is a red subpixel emitting red light, a second subpixel P2 is a white subpixel emitting white light, a third subpixel P3 is a blue subpixel emitting blue light, and a fourth subpixel P4 is a green subpixel emitting green light.

Each of the plurality of pixels P may be provided in a non-transmissive area NTA disposed between the transmissive areas TA. The plurality of pixels P may be disposed to be adjacent to each other in the non-transmissive area NTA in a second direction (e.g., Y-axis direction). For example, two of the plurality of pixels P may be disposed to be adjacent to each other in the non-transmissive area NTA with the first signal line SL1 interposed therebetween.

Each of the plurality of pixels P may include a first subpixel SP1, a second subpixel SP2 and a third subpixel SP3, and may further include a fourth subpixel SP4 in accordance with one embodiment. In each of the plurality of pixels P, the first subpixel SP1, the second subpixel SP2, the third subpixel SP3 and the fourth subpixel SP4 may be disposed based on a middle area. In this case, the middle area may indicate a middle area of each pixel P.

In detail, the first and second subpixels SP1 and SP2 may be disposed to be adjacent to each other based on the middle area of the pixel P in the first direction (e.g., X-axis direction), and the third and fourth subpixels SP3 and SP4 may be disposed to be adjacent to each other based on the middle area of the pixel P in the first direction (e.g., X-axis direction). One of the first and second subpixels SP1 and SP2 may be disposed to be adjacent to one of the third and fourth subpixels SP3 and SP4 in the second direction (e.g., Y-axis direction).

Each of the first subpixel SP1, the second subpixel SP2, the third subpixel SP3 and the fourth subpixel SP4, which are disposed as described above, may include a circuit element including a capacitor, a thin film transistor and the like, a plurality of signal lines for supplying a signal to the circuit element, and a light emitting element. The thin film transistor may include a switching transistor, a sensing transistor and a driving transistor TR.

In the display panel 110, the plurality of signal lines as well as the first subpixel SP1, the second subpixel SP2, the third subpixel SP3 and the fourth subpixel SP4 should be disposed in the non-transmissive area NTA except the transmissive area TA. Therefore, the first subpixel SP1, the second subpixel SP2, the third subpixel SP3 and the fourth subpixel SP4 may overlap at least one of the first signal line SL1 or the second signal line SL2.

Although FIGS. 3 to 5 show that the first subpixel SP1, the second subpixel SP2, the third subpixel SP3 and the fourth subpixel SP4 overlap at least a portion of the second signal line SL2 but do not overlap the first signal line SL1, the embodiment of the present disclosure is not limited thereto. In another embodiment, a portion of the first subpixel SP1, the second subpixel SP2, the third subpixel SP3 and the fourth subpixel SP4 may partially overlap the first signal line SL1.

The plurality of signal lines may include a first signal line SL1 extended in the first direction (e.g., X-axis direction) and a second signal line SL2 extended in the second direction (e.g., Y-axis direction) as described above.

The first signal line SL1 may include a scan line. The scan line may supply a scan signal to the subpixels SP1, SP2, SP3 and SP4 of the pixel P.

The second signal line SL2 may include at least one of data lines DL1 and DL2, a reference line REFL and a common power line VSSL, but is not limited thereto. The second signal line SL2 may further include a pixel power line.

The reference line REFL may supply a reference voltage (or an initialization voltage or a sensing voltage) to the driving transistor TR of each of the subpixels SP1, SP2, SP3 and SP4 provided in the display area DA.

Each of the data lines DL1 and DL2 may supply a data voltage to at least one of the subpixels SP1, SP2, SP3 and SP4 provided in the display area DA. For example, the first data line DL1 may supply a first data voltage to the driving transistor TR of each of the first and third subpixels SP1 and SP3, and the second data line DL2 may supply a second data voltage to the driving transistor TR of each of the second and fourth subpixels SP2 and SP4.

The pixel power line (not shown) may supply a first power source to the anode electrode 120 of each of the subpixels SP1, SP2, SP3 and SP4. The common power line VSSL may supply a second power source to the cathode electrodes 140 of each of the subpixels SP1, SP2, SP3 and SP4.

The switching transistor is switched in accordance with the scan signal supplied to the scan line to supply the data voltages supplied from the data lines DL1 and DL2 to the driving transistor TR.

The sensing transistor serves to sense a deviation in a threshold voltage of the driving transistor TR, which causes deterioration of image quality.

The driving transistor TR is switched in accordance with the data voltage supplied from the switching thin film transistor to generate a data current from a power source supplied from the pixel power line (not shown) and supply the data current to the anode electrode 120 of the subpixel. The driving transistor TR is provided for each of the subpixels SP1, SP2, SP3 and SP4, and includes an active layer ACT, a gate electrode GE, a source electrode SE and a drain electrode DE.

The capacitor serves to maintain the data voltage supplied to the driving transistor TR for one frame. The capacitor may include a first capacitor electrode and a second capacitor electrode but is not limited thereto. In another embodiment, the capacitor may include three capacitor electrodes.

Referring to FIG. 4 and FIG. 5, an active layer ACT may be provided over a first substrate 111. The active layer ACT may be formed of a silicon-based semiconductor material or an oxide-based semiconductor material.

A light shielding layer LS for shielding external light incident on the active layer ACT may be provided between the active layer ACT and the first substrate 111. The light-shielding layer LS may be formed of a material having conductivity, and may be formed of a single layer or multi-layer made of one of molybdenum (Mo), aluminum (Al), chromium (Cr), gold (Au), titanium (Ti), nickel (Ni), neodymium (Nd) and copper (Cu), or their alloy. In this case, a buffer layer BF may be provided between the light shielding layer LS and the active layer ACT.

A gate insulating layer GI may be provided over the active layer ACT. The gate insulating layer GI may be formed of an inorganic film, for example, a silicon oxide film (SiOX), a silicon nitride film (SiNx), or a multi-film of SiOx and SiNx.

A gate electrode GE may be provided over the gate insulating layer GI. The gate electrode GE may be formed of a single layer or multi-layer made of any one of molybdenum (Mo), aluminum (Al), chromium (Cr), gold (Au), titanium (Ti), nickel (Ni), neodymium (Nd) and copper (Cu), or their alloy.

An interlayer dielectric layer ILD may be provided over the gate electrode GE. The interlayer dielectric layer ILD may be formed of an inorganic film, for example, a silicon oxide film (SiOX), a silicon nitride film (SiNx), or a multi-film of SiOx and SiNx.

In addition, at least one of the plurality of signal lines may be provided in the same layer as the gate electrode GE. For example, the common power line VSSL may be formed of the same material as that of the gate electrode GE on the same layer as the gate electrode GE, but are not limited thereto.

The source electrode SE and the drain electrode DE may be provided over the interlayer dielectric layer ILD. The source electrode SE and the drain electrode DE may be connected to the active layer ACT through a contact hole that passes through the gate insulating layer GI and the interlayer dielectric layer ILD.

The source electrode SE and the drain electrode DE may be formed of a single layer or multi-layer made of any one of molybdenum (Mo), aluminum (Al), chromium (Cr), gold (Au), titanium (Ti), nickel (Ni), neodymium (Nd) and copper (Cu), or their alloy.

In addition, at least one of the plurality of signal lines may be provided in the same layer as the source electrode SE and the drain electrode DE. For example, the data lines DL1 and DL2, the reference line REFL may be formed of the same material as that of the source electrode SE and the drain electrode DE on the same layer as the source electrode SE and the drain electrode DE, but is not limited thereto. A common power pattern VSSP connected to the common power line VSSL through a contact hole may be further provided on the same layer as the source electrode SE and the drain electrode DE.

In FIG. 4 and FIG. 5, the data lines DL1 and DL2, the reference line REFL are disposed on the same layer as the source electrode SE and the drain electrode DE, and the common power line VSSL is disposed on the same layer as the gate electrode GE, but are not limited thereto. In another embodiment, each of the data lines DL1 and DL2, the reference line REFL, and the common power line VSSL may be disposed on the same layer as any one of the light-shielding layer LS, the gate electrode GE, the source electrode SE and the drain electrode DE.

A passivation layer PAS for protecting the driving transistors TR1, TR2, TR3 and TR4 may be provided over the source electrode SE and the drain electrode DE. A planarization layer PLN may be provided over the passivation layer PAS to planarize a step difference due to the driving transistor TR. The planarization layer PLN may not be provided in the transmissive area TA as shown in FIGS. 4 and 5.

For example, the planarization layer PLN may be made of an acryl-based material that contains photo acryl (PAC). The photo acryl (PAC) has excellent planarization properties and thus has excellent film-forming uniformity on a surface. Therefore, uniform light emitting characteristics of the light emitting element may be obtained.

However, the photo acryl (PAC) may have a yellowish color due to material properties. When a planarization layer PLN made of photo acryl (PAC) is provided over an entire surface including the transmissive area TA, a yellowish phenomenon may occur in the transmissive area TA. Therefore, light transmittance in the transmissive area TA may be deteriorated.

In the display panel 110 according to one embodiment of the present disclosure, the planarization layer PLN may be formed of a material having excellent planarization properties, for example, a photo acryl (PAC), and an opening overlapped with at least a portion of the transmissive area TA may be provided in the planarization layer PLN. Therefore, the display panel 110 according to one embodiment of the present disclosure may make sure of uniform light emitting characteristics of the light emitting element, and at the same time, may prevent a yellowish phenomenon from occurring in the transmissive area TA.

Meanwhile, at least a portion of a common power pattern VSSP may be exposed in the opening of the planarization layer PLN without being covered by the passivation layer PAS.

Light emitting elements comprised of an anode electrode 120, a light emitting layer 130 and a cathode electrode 140, and a bank 125 are provided over the planarization layer PLN.

The anode electrode 120 may be provided for each of the subpixels SP1, SP2, SP3 and SP4. In detail, a first anode electrode 121 may be provided in the first subpixel SP1, a second anode electrode 122 may be provided in the second subpixel SP2, a third anode electrode 123 may be provided in the third subpixel SP3, and a fourth anode electrode 124 may be provided in the fourth subpixel SP4. The anode electrode 120 is not provided in the transmissive area TA.

The anode electrode 120 may be provided over the planarization layer PLN and connected with the driving transistor TR. In detail, the first anode electrode 121 may be connected to a source electrode SE or a drain electrode DE of the driving transistor TR of the first subpixel SP1 through a first anode contact hole ACH1 that passes through the planarization layer PLN and the passivation layer PAS. The second anode electrode 122 may be connected to a source electrode SE or a drain electrode DE of the driving transistor TR of the second subpixel SP2 through a second anode contact hole ACH2 that passes through the planarization layer PLN and the passivation layer PAS. The third anode electrode 123 may be connected to a source electrode SE or a drain electrode DE of the driving transistor TR of the third subpixel SP3 through a third anode contact hole ACH3 that passes through the planarization layer PLN and the passivation layer PAS. The fourth anode electrode 124 may be connected to a source electrode SE or a drain electrode DE of the driving transistor TR of the fourth subpixel SP4 through a fourth anode contact hole ACH4 that passes through the planarization layer PLN and the passivation layer PAS. At this time, the first to fourth anode contact holes ACH1, ACH2, ACH3 and ACH4 may be disposed together in the middle area of the pixel P as shown in FIG. 3.

The anode electrode 120 may be formed of a metal material having high reflectance, such as a deposited structure (Ti/Al/Ti) of Al and Ti, a deposited structure (ITO/Al/ITO) of Al and ITO, Ag alloy, a deposited structure (ITO/Ag alloy/ITO) of Ag alloy and ITO, MoTi alloy, and a deposited structure (ITO/MoTi alloy/ITO) of MoTi alloy and ITO. The Ag alloy may be an alloy of Ag, Pd, Cu, and the like. The MoTi alloy may be an alloy of Mo and Ti.

The bank 125 may be provided over the anode electrode 120 and the planarization layer PLN. Light emission areas EA1, EA2, EA3 and EA4 of each of the subpixels SP1, SP2, SP3 and SP4 indicate areas in which the anode electrode 120, the organic light emitting layer 130 and the cathode electrode 140 are sequentially deposited so that holes from the anode electrode 120 and electrons from the cathode electrode 140 are combined with each other in the organic light emitting layer 130 to emit light. In this case, the area where the bank 125 is provided does not emit light and thus may be a non-emission area, and the area where the bank 125 is not provided and the anode electrode 120 is exposed may be the light emission areas EA1, EA2, EA3 and EA4.

The bank 125 may overlap at least a portion of the anode contact hole ACH to fill a step difference generated by the anode contact hole ACH. At this time, the bank 125 may be provided to cover or at least partially cover one anode contact hole ACH or a plurality of anode contact holes ACH in one pattern.

In detail, the bank 125 may cover or at least partially cover one anode contact hole ACH with one pattern, but is not limited thereto. For example, the bank 125 may cover or at least partially cover the first anode contact hole ACH1 of the first subpixel SP1 with one bank pattern, cover or at least partially cover the second anode contact hole ACH2 of the second subpixel SP2 with another bank pattern and cover or at least partially cover the third anode contact hole ACH3 of the third subpixel SP3 with still another bank pattern. The bank 125 may cover or at least partially cover the fourth anode contact hole ACH4 of the fourth subpixel SP4 with further still another bank pattern. As a result, four bank patterns may be provided in the first to fourth subpixels SP1, SP2, SP3 and SP4 provided in one pixel P. The bank patterns may be island patterns separated from each other.

In the display panel 110 according to one embodiment of the present disclosure, the bank 125 is not provided to cover or at least partially cover an end of the anode electrode 120, and may be provided with a small size in an area overlapped with the anode contact hole ACH. Therefore, in the display panel 110 according to one embodiment of the present disclosure, an end of at least one side of the anode electrode 120 may be exposed without being covered by the bank 125. Therefore, at least one side of the light emission area EA may be matched with the end of the anode electrode 120, which is exposed without being covered by the bank 125.

However, in the display panel 110 according to one embodiment of the present disclosure, the bank 125 may be provided over the anode contact hole ACH. The bank 125 fills the step difference of the anode contact hole ACH, whereby the cathode electrode 140 deposited over the upper portion of the bank 125 may be prevented from short-circuited with the anode electrode 120 due to the anode contact hole ACH.

At this time, the bank 125 has only to have an area capable of covering the anode contact hole ACH, and does not need to cover the end of the anode electrode 120. In the display panel 110 according to one embodiment of the present disclosure, the bank 125 has a small area, whereby the area where the anode electrode 120 is exposed without being covered by the bank 125 may be increased. That is, the display panel 110 according to one embodiment of the present disclosure may improve an aperture ratio.

Meanwhile, the bank 125 may cover or at least partially cover the plurality of anode contact holes ACH with one pattern, as shown in FIGS. 3 to 5. For example, the bank 125 may cover or at least partially cover the first anode contact hole ACH1 of the first subpixel SP1, the second anode contact hole ACH2 of the second subpixel SP2, the third anode contact hole ACH3 of the third subpixel SP3 and the fourth anode contact hole ACH4 of the fourth subpixel SP4 with one bank pattern. As a result, one bank pattern may be provided in the first to fourth subpixels SP1, SP2, SP3 and SP4 provided in one pixel P.

The first anode contact hole ACH1 of the first subpixel SP1, the second anode contact hole ACH2 of the second subpixel SP2, the third anode contact hole ACH3 of the third subpixel SP3 and the fourth anode contact hole ACH4 of the fourth subpixel SP4 may be disposed together in the middle area as shown in FIG. 3. In the display panel 110 according to one embodiment of the present disclosure, the first to fourth anode contact holes ACH1, ACH2, ACH3 and ACH4 gathered in the middle area may be covered or at least partially covered with a single bank pattern. At this time, the bank pattern may be one island pattern.

The first anode contact hole ACH1 of the first subpixel SP1, the second anode contact hole ACH2 of the second subpixel SP2, the third anode contact hole ACH3 of the third subpixel SP3 and the fourth anode contact hole ACH4 of the fourth subpixel SP4 may not be gathered in the middle area, unlike FIG. 3. In this case, in order to cover the first to fourth anode contact holes ACH1, ACH2, ACH3 and ACH4 with one bank pattern, the bank pattern may be provided among the first to fourth anode contact holes ACH1, ACH2, ACH3 and ACH4. The first to fourth anode contact holes ACH1, ACH2, ACH3 and ACH4 are not gathered, and a spaced distance among the first to fourth anode contact holes ACH1, ACH2, ACH3 and ACH4 is long, whereby an area of the bank pattern may be increased.

On the other hand, in the display panel 110 according to one embodiment of the present disclosure, the first to fourth anode contact holes ACH1, ACH2, ACH3 and ACH4 are disposed to be gathered in the middle area, whereby the spaced distance among the first to fourth anode contact holes ACH1, ACH2, ACH3 and ACH4 may be reduced. Therefore, the display panel 110 according to some embodiments of the present disclosure may reduce the area of the bank pattern and increase the aperture ratio. For example, the display panel 110 according to one embodiment of the present disclosure may minimize the area of the bank pattern and maximize the aperture ratio.

Meanwhile, in the display panel 110 according to one embodiment of the present disclosure, as shown in FIGS. 4 and 5, the end of at least one side of the anode electrode 120 may be exposed without being covered by the bank 125. At this time, a current is concentrated on the end of the anode electrode 120, whereby a problem may occur in that light emission efficiency is deteriorated. To solve the problem, in the display panel 110 according to one embodiment of the present disclosure, an inclination angle θ of the end of the anode electrode 120 may be provided to be equal to or less than 45°.

The bank 125 may be formed of an organic film such as an acrylic resin, an epoxy resin, a phenolic resin, a polyamide resin and a polyimide resin.

The organic light emitting layer 130 may be provided over the anode electrode 120. The organic light emitting layer 130 may include a hole transporting layer, a light emitting layer and an electron transporting layer. In this case, when a voltage is applied to the anode electrode 120 and the cathode electrode 140, holes and electrons move to the light emitting layer through the hole transport layer and the electron transport layer, respectively, and are combined with each other in the light emitting layer to emit light.

In one embodiment, the organic light emitting layer 130 may be a common layer commonly provided in the subpixels SP1, SP2, SP3 and SP4. In this case, the light emitting layer may be a white light emitting layer emitting white light.

In another embodiment, the organic light emitting layer 130 may be provided for each of the subpixels SP1, SP2, SP3 and SP4. For example, a red light emitting layer emitting red light may be provided in the first subpixel SP1, a white light emitting layer emitting white light may be provided in the second subpixel SP2, a blue light emitting layer emitting blue light may be provided in the third subpixel SP3, and a green light emitting layer emitting green light may be provided in the fourth subpixel SP4. In this case, the light emitting layer of the organic light emitting layer 130 is not provided in the transmissive area TA.

The cathode electrode 140 may be provided over the organic light emitting layer 130 and the bank 125. The cathode electrode 140 may be provided in the transmissive area TA as well as the non-transmissive area NTA including the light emission area EA, but is not limited thereto. The cathode electrode 140 may be provided only in the non-transmissive area NTA including the light emission areas EA1, EA2, EA3 and EA4, and may not be provided in the transmissive area TA to improve transmittance.

The cathode electrode 140 may be connected to a common power pattern VSSP exposed by an undercut structure UC. The undercut structure UC may be formed as an end of an upper layer provided over a lower layer is more protruded than the end of the lower layer.

In the display panel 110 according to one embodiment of the present disclosure, the passivation layer PAS and the planarization layer PLN may be provided over the common power pattern VSSP. At this time, at least a portion of the common power pattern VSSP may be exposed in the opening without being covered by the planarization layer PLN. The planarization layer PLN and the passivation layer PAS may correspond to the lower layer of the undercut structure UC.

The anode electrode 120 and an upper pattern UP spaced apart from the anode electrode 120 may be provided over the planarization layer PLN. The upper pattern UP is the upper layer of the undercut structure UC, and its end may be more protruded than the planarization layer PLN and the passivation layer PAS to form the undercut structure UC.

As described above, the cathode electrode 140 may be connected to the common power pattern VSSP exposed by the undercut structure UC, and may be supplied with the second power source from the common power line VSSL through the common power source pattern VSSP.

The cathode electrode 140 may be a common layer that is commonly provided in the subpixels SP1, SP2, SP3 and SP4 to apply the same voltage. The cathode electrode 140 may be formed of a conductive material capable of transmitting light. For example, the cathode electrode 140 may be formed of a transparent conductive material (TCO) such as ITO or IZO, or a semi-transmissive conductive material such as magnesium (Mg), silver (Ag), or an alloy of magnesium (Mg) and silver (Ag).

An encapsulation layer 150 may be provided over the light emitting elements. The encapsulation layer 150 may be provided over the cathode electrode 140 to cover or at least partially cover the cathode electrode 140. The encapsulation layer 150 serves to prevent oxygen or moisture from permeated into the organic light emitting layer 130 and the cathode electrode 140. Accordingly, in some embodiments, the encapsulation layer 150 may include at least one inorganic film and at least one organic film.

Although not shown in FIG. 5, a capping layer may additionally be provided between the cathode electrode 140 and the encapsulation layer 150.

A color filter CF may be provided over the encapsulation layer 150. The color filter CF may be provided over one surface of the second substrate 112 facing the first substrate 111. In this case, the first substrate 111 provided with the encapsulation layer 150 and the second substrate 112 provided with the color filter CF may be bonded to each other by a separate adhesive layer (not shown). The adhesive layer (not shown) may be an optically clear resin layer (OCR) or an optically clear adhesive film (OCA).

The color filter CF may be provided to be patterned for each of the subpixels SP1, SP2, SP3 and SP4. In detail, the color filter CF may include a first color filter CF1, a third color filter CF3 and a fourth color filter CF4. The first color filter CF1 may be disposed to correspond to the light emission area EA1 of the first subpixel SP1, and may be a red color filter that transmits red light. The third color filter CF3 may be disposed to correspond to the light emission area EA3 of the third subpixel SP3, and may be a blue color filter that transmits blue light. The fourth color filter CF4 may be disposed to correspond to the light emission area EA4 of the fourth subpixel SP4, and may be a green color filter that transmits green light.

Although FIG. 4 does not show a second color filter corresponding to the light emission area EA2 of the second subpixel SP2, the embodiment of the present disclosure is not limited thereto. The color filter CF may further include a second color filter CF2. The second color filter (not shown) may be disposed to correspond to the light emission area EA2 of the second subpixel SP2, and may be a white color filter that transmits white light. The white color filter may be formed of a transparent organic material that transmits white light.

A black matrix BM may be provided between the color filters CF. The black matrix BM may be provided among the subpixels SP1, SP2, SP3 and SP4 to prevent a color mixture between adjacent subpixels SP1, SP2, SP3 and SP4 from occurring.

Although not shown in FIGS. 4 and 5, the black matrix BM may be provided between the color filter CF and the transmissive area TA. The black matrix BM may be provided between the transmissive area TA and the plurality of subpixels SP1, SP2, SP3 and SP4 to prevent light emitted from each of the plurality of subpixels SP1, SP2, SP3 and SP4 from moving to the transmissive area TA.

The black matrix BM may include a material that absorbs light, for example, a black dye that absorbs all of light in a visible wavelength range.

In the display panel 110 according to some embodiments of the present disclosure, the bank 125 is provided to cover or at least partially cover the anode contact hole ACH and the end of at least one side of the anode electrode 120 is exposed, whereby the area of the bank 125 may be reduced, and an aperture ratio may be increased. For example, the display panel 110 according to one embodiment of the present disclosure may have a minimized area of the bank 125 and a maximized aperture ratio.

In addition, in the display panel 110 according to one embodiment of the present disclosure, the inclination angle θ of the end of the anode electrode 120 is equal to or less than 45°, whereby light emission efficiency may be prevented from being deteriorated due to the current concentrated on the end of the anode electrode 120.

For example, the anode electrode 120 (particularly, the first anode electrode 121 as shown in FIG. 4) extends between a first end and a second end opposite the first end. The first end overlaps with the bank layer 125. The second end, on the other hand, gradually tapers as it approaches one end of the planarization layer PLN (see enlarged view of the second end in FIG. 4). The inclination angle θ is formed based on a top surface of the planarization layer and a top surface of the second end of the first anode electrode 121. The enlarged view in FIG. 4 also shows that the second electrode 140 changes its inclination angle according to the first anode electrode 121 at a corresponding location.

In FIGS. 3 to 5, the first to fourth subpixels SP1, SP2, SP3 and SP4 provided in one pixel P are disposed around the middle area, but are not limited thereto. In another embodiment, the first to fourth subpixels SP1, SP2, SP3 and SP4 provided in one pixel P may be disposed in a line in the first direction (e.g., X-axis direction) or the second direction (e.g., Y-axis direction).

Hereinafter, an example in which the bank 125 is provided in a pixel structure, in which the first to fourth subpixels SP1, SP2, SP3 and SP4 are disposed in a line in the second direction (e.g., Y-axis direction), will be described with reference to FIGS. 6 to 11.

Figure 6:
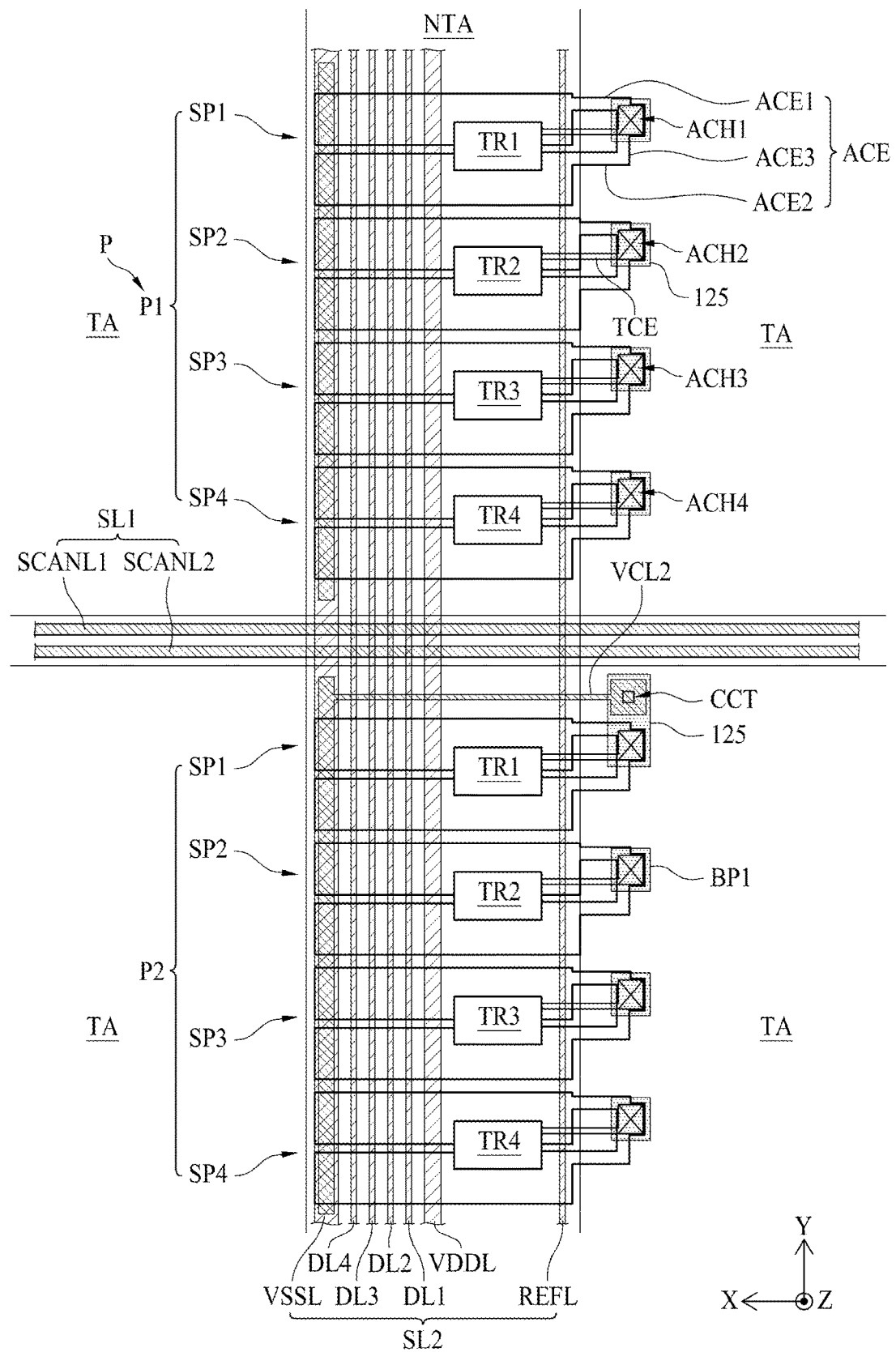
FIG. 6 is a view illustrating another example of a pixel provided in a transparent display panel.
Figure 7:
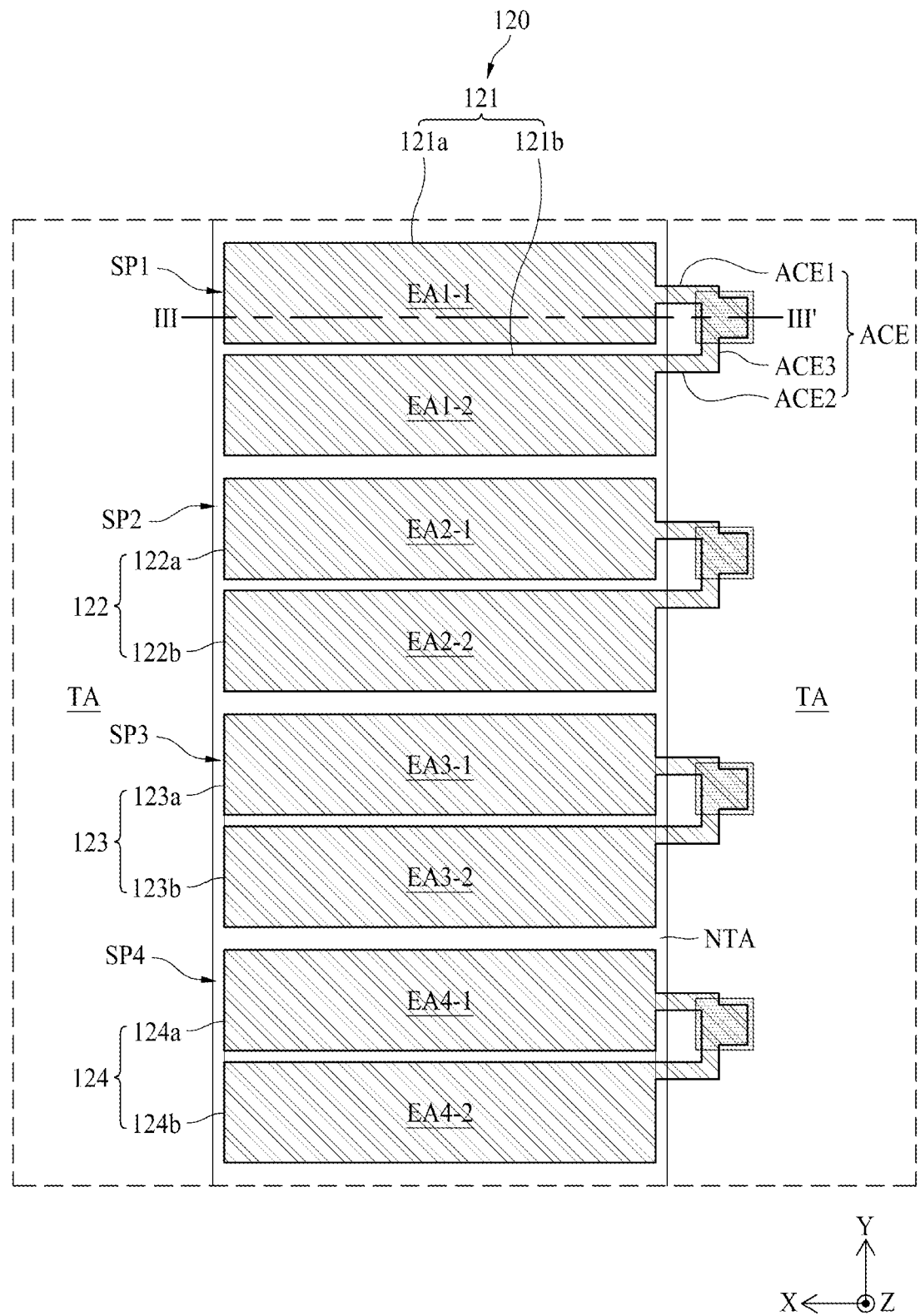
FIG. 7 is a view illustrating an anode electrode and a bank in the pixel of FIG. 6.
Figure 8:
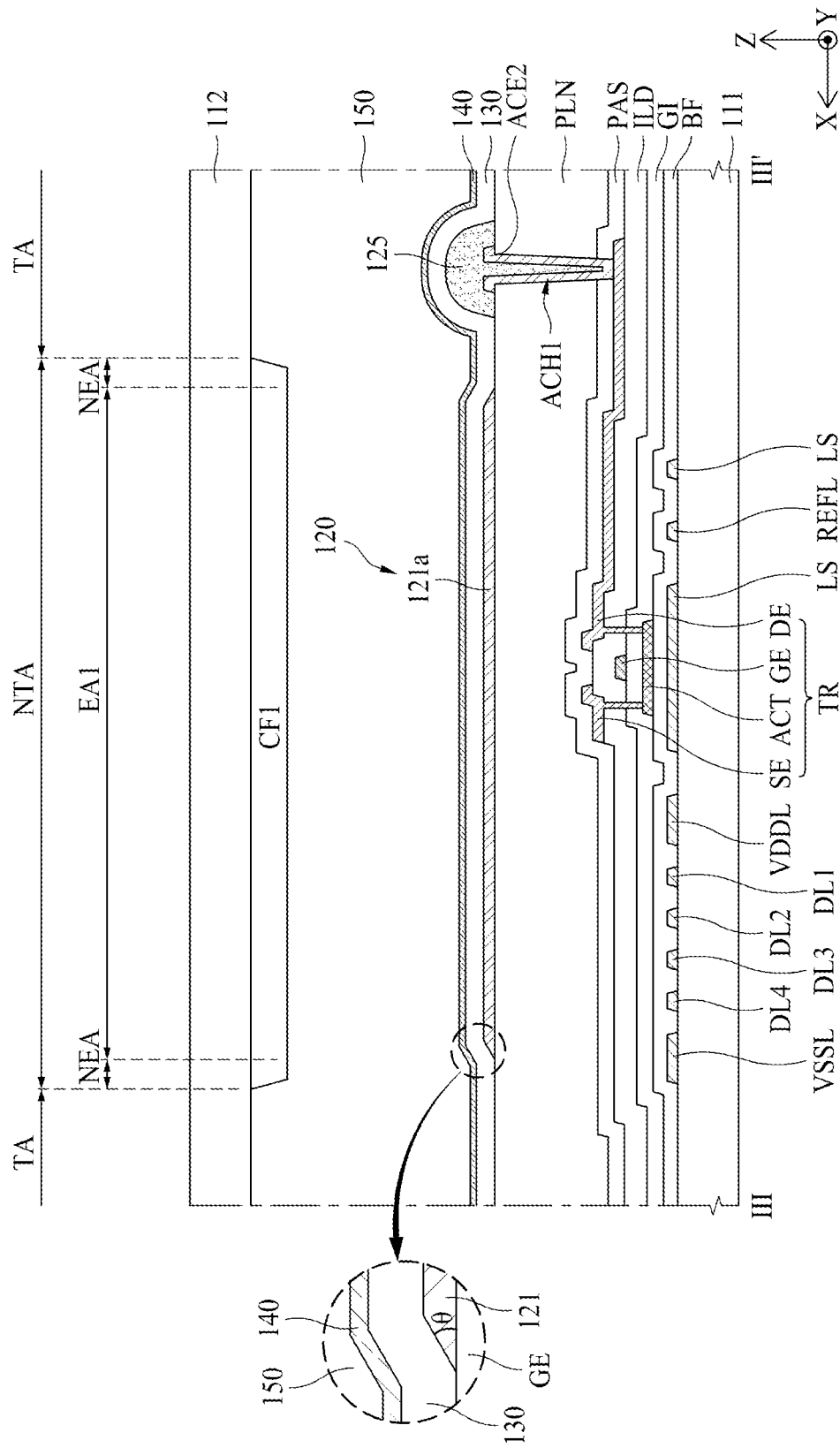
FIG. 8 is a cross-sectional view taken along line of FIG. 6.
Figure 9:
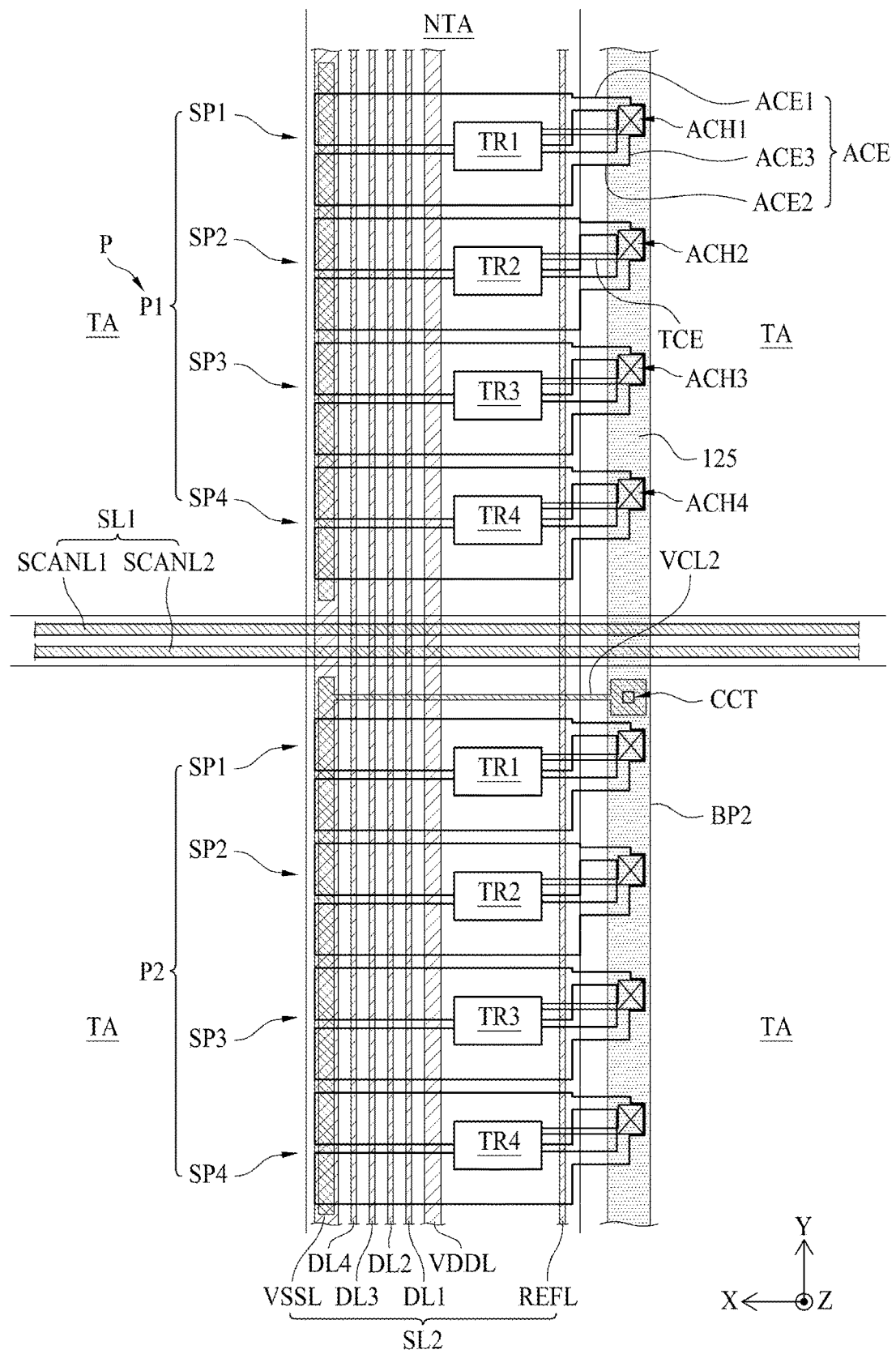
FIG. 9 is a view illustrating a modified embodiment of FIG. 6.
Figure 10:
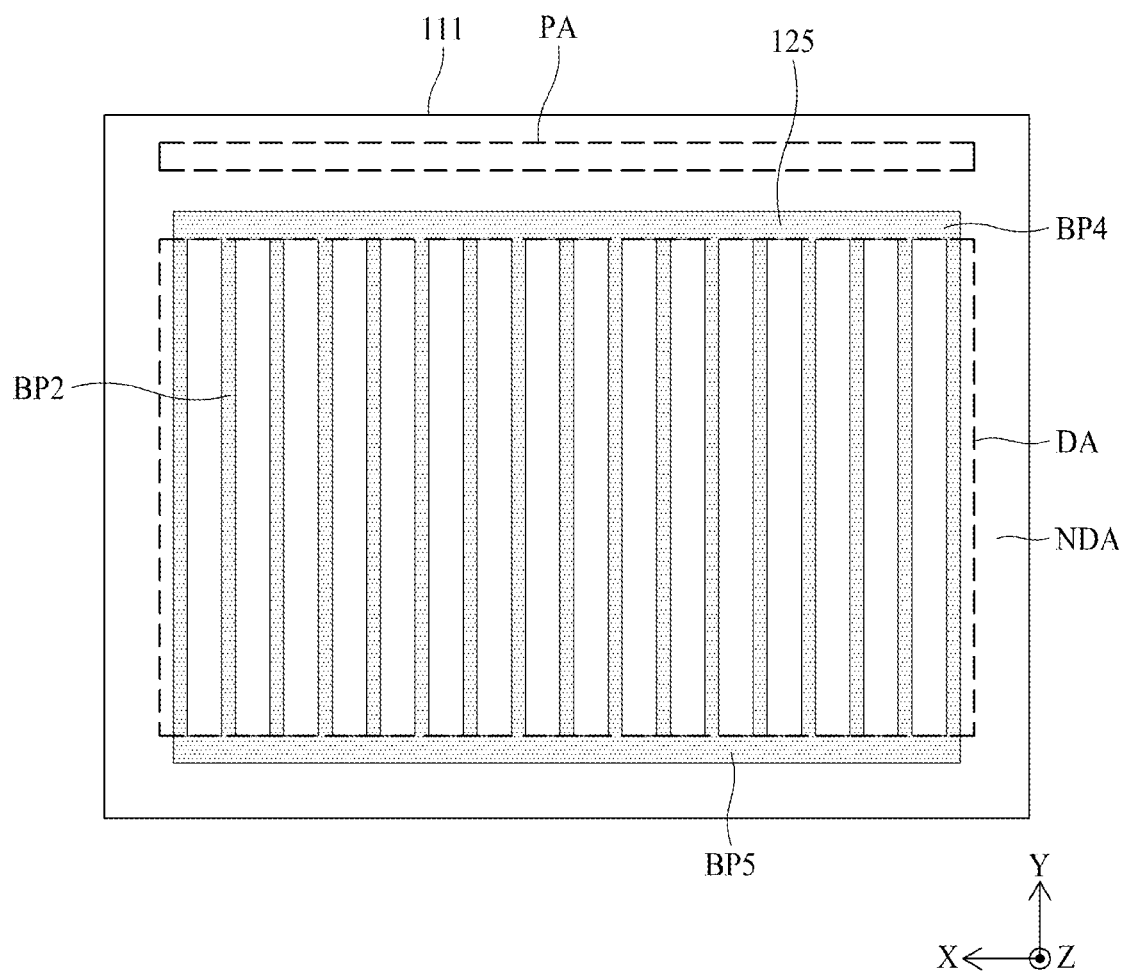
FIG. 10 is a view illustrating an example of a bank provided in an entire area of a transparent display panel.
Figure 11:
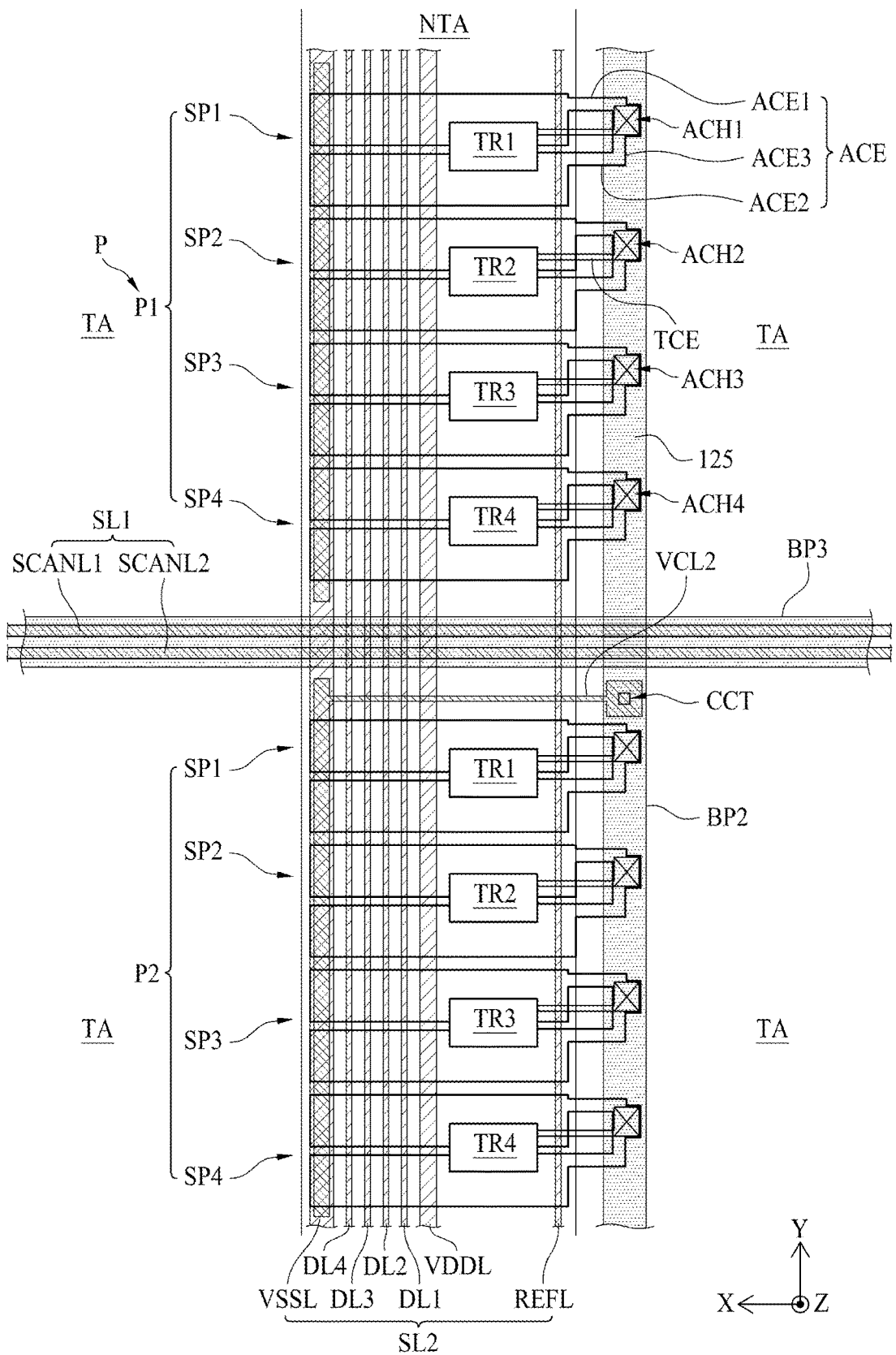
FIG. 11 is a view illustrating another modified embodiment of FIG. 6.

FIG. 6 is a view illustrating another example of a pixel provided in a transparent display panel, FIG. 7 is a view illustrating an anode electrode and a bank in the pixel of FIG. 6, and FIG. 8 is a cross-sectional view taken along line of FIG. 6. FIG. 9 is a view illustrating a modified embodiment of FIG. 6, FIG. 10 is a view illustrating an example of a bank provided in an entire area of a transparent display panel, and FIG. 11 is a view illustrating another modified embodiment of FIG. 6.

Referring to FIGS. 6 to 11, each of the pixels P is provided to overlap the first signal line SL1 or the second signal line SL2 and emits predetermined light to display an image. The light emission area EA may correspond to an area that emits light in the pixel P.

Each of the pixels P may include at least one of a first subpixel SP1, a second subpixel SP2, a third subpixel SP3 or a fourth subpixel SP4. The first subpixel SP1 may be provided to include a first light emission area EA1 emitting red light, the second subpixel SP2 may be provided to include a second light emission area EA2 emitting white light, the third subpixel SP3 may be provided to include a third light emission area EA3 emitting blue light, and the fourth subpixel SP4 may be provided to include a fourth light emission area EA4 emitting green light, but they are not limited thereto. Each of the pixels P may include a subpixel that emits light of a color other than red, green, blue and white. In addition, the arrangement order of each of the subpixels SP1, SP2, SP3 and SP4 may be changed in various ways.

Meanwhile, the light emission areas EA1, EA2, EA3 and EA4 included in each of the plurality of subpixels SP1, SP2, SP3 and SP4 may include a plurality of divided light emission areas. In detail, the first light emission area EA1 provided in the first subpixel SP1 may include two divided emission areas, that is, a first divided light emission area EA1-1 and a second divided light emission area EA1-2. The second light emission area EA2 provided in the second subpixel SP2 may include two divided emission areas, that is, a first divided light emission area EA2-1 and a second divided light emission area EA2-2. The third light emission area EA3 provided in the third subpixel SP3 may include two divided emission areas, that is, a first divided light emission area EA3-1 and a second divided light emission area EA3-2. The fourth light emission area EA4 provided in the fourth subpixel SP4 may include two divided emission areas, that is, a first divided light emission area EA4-1 and a second divided light emission area EA4-2.

Each of the plurality of pixels P may be provided in the non-transmissive area NTA disposed between transmissive areas TA. The plurality of pixels P may be disposed to be adjacent to each other in the non-transmissive area NTA in the second direction (e.g., Y-axis direction). For example, the plurality of pixels P may include a first pixel P1 provided over one side of the first signal line SL1 and a second pixel P2 provided over the other side of the first signal line SL1. Each of the first pixel P1 and the second pixel P2 may include a first subpixel SP1, a second subpixel SP2 and a third subpixel SP3, and may further include a fourth subpixel SP4 in accordance with one embodiment.

The first subpixel SP1, the second subpixel SP2, the third subpixel SP3 and the fourth subpixel SP4, which are provided in each of the first pixel P1 and the second pixel P2, may be disposed in a line in the second direction. In detail, the first subpixel SP1, the second subpixel SP2, the third subpixel SP3 and the fourth subpixel SP4, which are provided in the first pixel P1, may be disposed in a line from one side of the first signal line SL1 to the second direction. The first subpixel SP1, the second subpixel SP2, the third subpixel SP3 and the fourth subpixel SP4, which are provided in the second pixel P2, may be disposed in a line from the other side of the first signal line SL1 to the second direction.

Each of the first subpixel SP1, the second subpixel SP2, the third subpixel SP3 and the fourth subpixel SP4, which are disposed as described above, may include a circuit element including a capacitor, a thin film transistor and the like, a plurality of signal lines for supplying a signal to the circuit element, and a light emitting element. The thin film transistor may include a switching transistor, a sensing transistor, and driving transistors TR1, TR2, TR3 and TR4.

In the display panel 110, the plurality of signal lines as well as the first subpixel SP1, the second subpixel SP2, the third subpixel SP3 and the fourth subpixel SP4 should be disposed in the non-transmissive area NTA except the transmissive area TA. Therefore, the first subpixel SP1, the second subpixel SP2, the third subpixel SP3 and the fourth subpixel SP4 overlap at least one of the first signal line SL1 or the second signal line SL2.

Although FIG. 6 shows that the first subpixel SP1, the second subpixel SP2, the third subpixel SP3 and the fourth subpixel SP4 overlap at least a portion of the second signal line SL2 but do not overlap the first signal line SL1, the embodiment of the present disclosure is not limited thereto. In another embodiment, a portion of the first subpixel SP1, the second subpixel SP2, the third subpixel SP3 and the fourth subpixel SP4 may partially overlap the first signal line SL1.

The plurality of signal lines may include a first signal line SL1 extended in the first direction (e.g., X-axis direction) and a second signal line SL2 extended in the second direction (e.g., Y-axis direction) as described above.

The first signal line SL1 may include a first scan line SCANL1 and a second scan line SCANL2. The first scan line SCANL1 may supply a scan signal to the subpixels SP1, SP2, SP3 and SP4 of the first pixel P1 disposed at a first side, for example, an upper side. The second scan line SCANL2 may supply a scan signal to the subpixels SP1, SP2, SP3 and SP4 of the second pixel P2 disposed at a second side, for example, a lower side.

The second signal line SL2 may include at least one of data lines DL1, DL2, DL3 and DL4, a pixel power line VDDL, a reference line REFL and a common power line VSSL, but is not limited thereto.

The reference line REFL may supply a reference voltage (or an initialization voltage or a sensing voltage) to the driving transistors TR1, TR2, TR3 and TR4 of the subpixels SP1, SP2, SP3 and SP4 provided in the display area DA.

Each of the data lines DL1, DL2, DL3 and DL4 may supply a data voltage to at least one of the subpixels SP1, SP2, SP3 and SP4 provided in the display area DA. For example, the first data line DL1 may supply a first data voltage to a first driving transistor TR1 of the first subpixel SP1, the second data line DL2 may supply a second data voltage to a second driving transistor TR2 of the second subpixel SP2, the third data line DL3 may supply a third data voltage to a third driving transistor TR3 of the third subpixel SP3, and the fourth data line DL4 may supply a fourth data voltage to a fourth driving transistor TR4 of the fourth subpixel SP4.

The pixel power line VDDL may supply a first power source to the anode electrode 120 of each of the subpixels SP1, SP2, SP3 and SP4. The common power line VSSL may supply a second power source to the cathode electrode 140 of each of the subpixels SP1, SP2, SP3 and SP4.

Since the switching transistor, the sensing transistor, the driving transistors TR1, TR2, TR3 and TR4 and the capacitor are substantially the same as those of the display panel 110 shown in FIGS. 3 to 5, their description will be omitted.

A passivation layer PAS may be provided over the circuit element including the switching transistor, the sensing transistor, the driving transistors TR1, TR2, TR3 and TR4 and the capacitor and the plurality of signal lines supplying a signal to the circuit element. A planarization layer PLN for planarizing a step difference due to the driving transistors TR1, TR2, TR3 and TR4 may be provided over the passivation layer PAS.

Light emitting elements comprised of an anode electrode 120, a light emitting layer 130 and a cathode electrode 140, and a bank 125 are provided over the planarization layer PLN.

The anode electrode 120 may be provided for each of the subpixels SP1, SP2, SP3 and SP4. In detail, a first anode electrode 121 may be provided in the first subpixel SP1, a second anode electrode 122 may be provided in the second subpixel SP2, a third anode electrode 123 may be provided in the third subpixel SP3, and a fourth anode electrode 124 may be provided in the fourth subpixel SP4. The anode electrode 120 is not provided in the transmissive area TA.

The anode electrode 120 may be provided over the planarization layer PLN and connected with the driving transistors TR1, TR2, TR3 and TR4. In detail, the first anode electrode 121 may be connected to a source electrode SE or a drain electrode DE of the first driving transistor TR1 of the first subpixel SP1 through a first anode contact hole ACH1 that passes through the planarization layer PLN and the passivation layer PAS. The second anode electrode 122 may be connected to a source electrode SE or a drain electrode DE of the second driving transistor TR2 of the second subpixel SP2 through a second anode contact hole ACH2 that passes through the planarization layer PLN and the passivation layer PAS. The third anode electrode 123 may be connected to a source electrode SE or a drain electrode DE of the third driving transistor TR3 of the third subpixel SP3 through a third anode contact hole ACH3 that passes through the planarization layer PLN and the passivation layer PAS. The fourth anode electrode 124 may be connected to a source electrode SE or a drain electrode DE of the fourth driving transistor TR4 of the fourth subpixel SP4 through a fourth anode contact hole ACH4 that passes through the planarization layer PLN and the passivation layer PAS.

The anode electrodes 121, 122, 123 and 124 included in each of the plurality of subpixels SP1, SP2, SP3 and SP4 may be provided in a plural number. For example, the anode electrodes 121, 122, 123 and 124 included in each of the plurality of subpixels SP1, SP2, SP3 and SP4 may include first anode divided electrodes 121*a*, 122*a*, 123*a* and 124*a* and second anode divided electrodes 121*b*, 122*b*, 123*b* and 124*b*. The first anode divided electrodes 121*a*, 122*a*, 123*a* and 124*a* and the second anode divided electrodes 121*b*, 122*b*, 123*b* and 124*b* may be disposed to be spaced apart from each other in the same layer.

The display panel 110 according to one embodiment of the present disclosure may further include an anode connection electrode ACE for connecting the first anode divided electrodes 121*a*, 122*a*, 123*a* and 124*a* with the second anode divided electrodes 121*b*, 122*b*, 123*b* and 124*b*. As shown in FIGS. 6 and 7, the anode connection electrode ACE may include a first anode connection portion ACE1, a second anode connection portion ACE2 and a third anode connection portion ACE3.

The first anode connection portion ACE1 may be extended from the first anode divided electrodes 121a, 122a, 123a and 124a toward the transmissive area TA as much as a predetermined length or a selected length. The second anode connection portion ACE2 may be extended from the second anode divided electrodes 121b 122b, 123b and 124b toward the transmissive area TA as much as a predetermined length or a selected length.

The third anode connection portion ACE3 may connect one end of the first anode connection portion ACE1 with one end of the second anode connection portion ACE2. Therefore, the first anode divided electrodes 121a, 122a, 123a and 124a may electrically be connected with the second anode divided electrodes 121b 122b, 123b and 124b through the anode connection electrode ACE.

The first anode connection portion ACE1, the second anode connection portion ACE2 and the third anode connection portion ACE3 may integrally be formed in the same layer as the first anode divided electrodes 121a, 122a, 123a and 124a and the second anode divided electrodes 121b, 122b, 123b and 124b. The areas in which the first anode connection portion ACE1, the second anode connection portion ACE2 and the third anode connection portion ACE3 are formed may be the non-transmissive areas NTA, but are not limited thereto. In another embodiment, the first anode connection portion ACE1, the second anode connection portion ACE2 and the third anode connection portion ACE3 may be made of a transparent conductive material. In this case, the areas in which the first anode connection portion ACE1, the second anode connection portion ACE2 and the third anode connection portion ACE3 are formed may be the transmissive areas TA.

The anode electrodes 121, 122, 123 and 124 may electrically be connected with the driving transistors TR1, TR2, TR3 and TR4 through the anode connection electrode ACE and a transistor connection electrode TCE.

The transistor connection electrode TCE may be disposed between the first anode connection portion ACE1 and the second anode connection portion ACE2. The transistor connection electrode TCE may be extended from the source electrode SE or the drain electrode DE of the driving transistors TR1, TR2, TR3 and TR4 toward the transmissive area TA as much as a predetermined length or a selected length. The transistor connection electrode TCE may at least partially overlap the third anode connection portion ACE3, and may electrically be connected with the third anode connection portion ACE3 through the anode contact hole ACH in an area overlapped with the third anode connection portion ACE3.

The area in which the transistor connection electrode TCE is provided may be the non-transmissive area NTA, but is not limited thereto. The transmissive area TA may be provided between the transistor connection electrode TCE and the first anode connection portion ACE1 and between the transistor connection electrode TCE and the second anode connection portion ACE2. In another embodiment, the transistor connection electrode TCE may be made of a transparent conductive material. In this case, the area in which the transistor connection electrode TCE is provided may be the transmissive area TA.

In the display panel 110 according to one embodiment of the present disclosure, particles may enter one of the first anode divided electrodes 121a, 122a, 123a and 124a and the second anode divided electrodes 121b, 122b, 123b and 124b during a process, whereby a dark spot may occur. In this case, the display panel 110 according to one embodiment of the present disclosure may be repaired by cutting at least one of the first anode connection portion ACE1 or the second anode connection portion ACE2 of the anode connection electrode ACE.

For example, in the display panel 110 according to one embodiment of the present disclosure, when a short occurs between the first anode divided electrodes 121a, 122a, 123a and 124a and the cathode electrode 140 due to particles in the area in which the first anode divided electrodes 121a, 122a, 123a and 124a are provided, the display panel 110 may be repaired by cutting the first anode connection portion ACE1 by a laser.

For another example, when a short occurs between the second anode divided electrodes 121b 122b, 123b and 124b and the cathode electrode 140 due to particles in the area in which the second anode division electrodes 121b 122b, 123b and 124b are provided, the display panel 110 may be repaired by cutting the second anode connection portion ACE2 by a laser.

In the display panel 110 according to one embodiment of the present disclosure, even though a dark spot occurs due to particles, only the corresponding anode electrode among the plurality of anode divided electrodes 121a, 122a, 123a, 124a, 121b, 122b, 123b and 124b may be short-circuited through cutting, whereby a light loss rate due to occurrence of the dark spot may be reduced.

Meanwhile, in the display panel 110 according to one embodiment of the present disclosure, a defect may occur in the driving transistors TR1, TR2, TR3 and TR4. When the display panel 110 according to one embodiment of the present disclosure operates in error by the driving transistors TR1, TR2, TR3 and TR4, the transistor connection electrode TCE may be cut by a laser to electrically separate the driving transistors TR1, TR2, TR3 and TR4 of the corresponding subpixel from the anode electrode 120. Therefore, a signal applied from the driving transistors TR1, TR2, TR3 and TR4 may be blocked from being applied to the subpixel having a defect in the driving transistors TR1, TR2, TR3 and TR4, whereby the subpixel having a defect may not emit light.

The first anode divided electrodes 121a, 122a, 123a and 124a and the second anode divided electrodes 121b, 122b, 123b and 124b may be formed of a metal material having high reflectance, such as a deposited structure (Ti/Al/Ti) of Al and Ti, a deposited structure (ITO/Al/ITO) of Al and ITO, a deposited structure (ITO/Ag/ITO) of Ag and ITO, Ag alloy, and a deposited structure (ITO/Ag alloy/ITO) of Ag alloy and ITO. The Ag alloy may be an alloy of Ag, Pd, Cu, and the like.

The bank 125 may be provided over the anode connection electrode ACE and the planarization layer PLN. The bank 125 may be provided to overlap at least a portion of the anode contact hole ACH to fill a step difference generated by the anode contact hole ACH. At this time, the bank 125 may be provided to cover or at least partially cover one anode contact hole or a plurality of anode contact holes ACH with one pattern.

In detail, as shown in FIGS. 6 and 7, the bank 125 may cover or at least partially cover one anode contact hole ACH with one first bank pattern BP1, but is not limited thereto. For example, the bank 125 may cover or at least partially cover the first anode contact hole ACH1 of the first subpixel SP1 with one bank pattern, cover or at least partially cover the second anode contact hole ACH2 of the second subpixel SP2 with another bank pattern and cover the or at least partially cover third anode contact hole ACH3 of the third subpixel SP3 with still another bank pattern. The bank 125 may cover or at least partially cover the fourth anode contact hole ACH4 of the fourth subpixel SP4 with further still another bank pattern. As a result, four bank patterns may be provided in the first to fourth subpixels SP1, SP2, SP3 and SP4 provided in one pixel P. At this time, the first bank patterns BP1 may be island patterns separated from each other.

In the display panel 110 according to another embodiment of the present disclosure, the bank 125 may be provided with a small area in the area overlapped with the anode contact hole ACH without covering the ends of the anode electrodes 121, 122, 123 and 124. Therefore, in the display panel 110 according to another embodiment of the present disclosure, the end of at least one side of the anode electrodes 121, 122, 123 and 124 may be exposed without being covered by the bank 125. Therefore, at least one side of the light emission area EA may be matched with the ends of the anode electrodes 121, 122, 123 and 124, which are exposed without being covered by the bank 125.

In the display panel 110 according to another embodiment of the present disclosure, two of the anode divided electrodes 121a, 122a, 123a, 124a, 121b, 122b, 123b and 124b may be connected with each other through the anode connection electrode ACE, and the anode connection electrode ACE may be connected to the driving transistors TR1, TR2, TR3 and TR4 through the anode connection holes ACH1, ACH2, ACH3 and ACH4. In the display panel 110 according to another embodiment of the present disclosure, the anode contact holes ACH1, ACH2, ACH3 and ACH4 may be disposed to be spaced apart from the anode divided electrodes 121a, 122a, 123a, 124a, 121b, 122b, 123b and 124b.

Therefore, in the display panel 110 according to another embodiment of the present disclosure, the bank 125 may not be provided over the anode divided electrodes 121a, 122a, 123a, 124a, 121b, 122b, 123b and 124b. Therefore, in the display panel 110 according to another embodiment of the present disclosure, all sides of the anode divided electrodes 121a, 122a, 123a, 124a, 121b, 122b, 123b and 124b may be exposed without being covered by the bank 125. As a result, in the display panel 110 according to another embodiment of the present disclosure, as shown in FIG. 7, the anode divided electrodes 121a, 122a, 123a, 124a, 121b, 122b, 123b, 124b may be matched with the light emission area EA. For example, the area in which the first anode divided electrodes 121a, 122a, 123a and 124a are provided may be first divided light emission areas EA1-1, EA2-1, EA3-1 and EA4-1. In addition, the area in which the second anode divided electrodes 121b, 122b, 123b and 124b are provided may be second divided light emission areas EA1-2, EA2-2, EA3-2 and EA4-2.

In the display panel 110 according to another embodiment of the present disclosure, the bank 125 may be provided over the anode contact holes ACH1, ACH2, ACH3 and ACH4, whereby the bank 125 may fill the step difference of the anode contact holes ACH1, ACH2, ACH3 and ACH4, as shown in FIG. 8. Therefore, in the display panel 110 according to another embodiment of the present disclosure, the cathode electrode 140 deposited over the upper portion of the bank 125 may be prevented from being short-circuited with the anode electrode 120 due to the anode contact holes ACH1, ACH2, ACH3 and ACH4.

At this time, the bank 125 has only to have an area that may cover or at least partially cover the anode contact holes ACH1, ACH2, ACH3 and ACH4, and does not need to cover the end of the anode electrode 120. In the display panel 110 according to another embodiment of the present disclosure, since the bank 125 has a small area, the anode electrode 120 is exposed without being covered by the bank 125, whereby an aperture ratio may be improved.

Meanwhile, as shown in FIG. 9, the bank 125 may cover or at least partially cover the plurality of anode contact holes ACH1, ACH2, ACH3 and ACH4 with one second bank pattern BP2. For example, the bank 125 may cover or at least partially cover the first anode contact hole ACH1 of the first subpixel SP1, the second anode contact hole ACH2 of the second subpixel SP2, the third anode contact hole ACH3 of the third subpixel SP3 and the fourth anode contact hole ACH4 of the fourth subpixel SP4 with one second bank pattern BP2.

Therefore, as shown in FIG. 10, the bank 125 may be disposed in the form of a grid while exposing at least one side of the plurality of anode electrodes 120 in the display area DA. In detail, the bank 125 may include a plurality of second bank patterns BP2 extended from the display area DA in the second direction (e.g., Y-axis direction) as shown in FIG. 10. At this time, the second bank pattern BP2 may be a line pattern. In some embodiments, the second bank pattern BP2 is a strip-like shape that extends along a certain direction (in FIG. 9, the second bank pattern BP2 extends along the Y-axis). The second bank pattern BP2 provided in the display area DA may be provided between the transmissive area TA and the plurality of subpixels SP1, SP2, SP3 and SP4, as shown in FIG. 9. Meanwhile, a fourth bank pattern BP4 and a fifth bank pattern BP5 may be provided in the non-display area NDA. The fourth bank pattern BP4 may be disposed in the non-display area NDA disposed on one side of the display area DA and extended in the first direction (e.g., X-axis direction). The fifth bank pattern BP5 may be disposed in the non-display area NDA disposed on the other side of the display area DA and extended in the first direction (e.g., X-axis direction). The plurality of second bank patterns BP2 may be extended from the display area DA in the second direction and connected with the fourth bank pattern BP4 and the fifth bank pattern BP5.

Referring back to FIG. 9, the second bank pattern BP2 may overlap at least a portion of the cathode contact portion CCT while being extended in the second direction (e.g., Y-axis direction). In the display panel 110 according to another embodiment of the present disclosure, the cathode contact portion CCT for connecting the common power line VDDL with the cathode electrode 140 may be disposed to overlap at least a portion of the second bank pattern BP2.

In the display panel 110 according to the modified embodiment of the present disclosure, the bank 125 is provided with the second bank pattern BP2 in the form of a line as shown in FIGS. 9 and 10, whereby the bank 125 may be prevented from being damaged during the manufacturing process. The first bank pattern BP1 of an island shape may minimize influence on light transmittance due to its small area, but it is likely that the bank 125 may be damaged by a cleaning process or an external force. To avoid this, in the display panel 110 according to the modified embodiment of the present disclosure, the bank 125 may be provided with the second bank pattern BP2 of a line shape. Therefore, a contact area between the bank 125 and the lower layer may be increased, and interfacial adhesion may be improved.

FIG. 9 and FIG. 10 show that the bank 125 has only the second bank pattern BP2 extended in the second direction (e.g., Y-axis direction), but is not limited thereto. In another modified embodiment, the display panel 110 may include a second bank pattern BP2 in which the bank 125 is extended in the second direction (e.g., Y-axis direction) and a third bank pattern BP3 in which the bank 125 is extended in the first direction (e.g., X-axis direction) as shown in FIG. 11. At this time, the third bank pattern BP3 may be disposed to overlap at least a portion of the first signal line SL1. The area in which the first signal line SL1 is provided is the non-transmissive area NTA but does not include one or more anode electrodes 121, 122, 123 and 124. Therefore, the display panel 110 according to the modified embodiment of the present disclosure may improve interfacial adhesion between the bank 125 and the lower layer without reducing an aperture ratio even though the third bank pattern BP3 is provided over the first signal line SL1. In some embodiments, the third bank pattern BP3 is a strip-like shape that extends along a certain direction (in FIG. 11, the third bank pattern BP3 extends along the X-axis). As shown in FIG. 11, the second bank pattern BP2 and the third bank pattern BP3 overlaps each other at a location adjacent to at least one of the first, second, third, and fourth contact holes. For example, the overlapping location of the second bank pattern BP2 and the third bank pattern BP3 is adjacent to the fourth anode contact hole ACH4 (of a transmissive area TA in the top right of FIG. 11) and the first anode contact hole ACH1 (of a transmissive area TA in the bottom right of FIG. 11).

Meanwhile, in the display panel 110 according to another embodiment of the present disclosure, as shown in FIG. 8, the ends of the anode electrodes 121, 122, 123 and 124 may be exposed without being covered by the bank 125. In this case, a current may be concentrated on the ends of the anode electrodes 121, 122, 123 and 124, whereby a problem may occur in that light emission efficiency is deteriorated. To solve this problem, in the display panel 110 according to another embodiment of the present disclosure, the inclination angle θ of the ends of the anode electrodes 121, 122, 123 and 124 may be provided to be equal to or less than 45°.

The bank 125 may be formed of an organic film such as an acrylic resin, an epoxy resin, a phenolic resin, a polyamide resin and a polyimide resin.

The organic light emitting layer 130 may be provided over the anode electrode 120. The organic light emitting layer 130 may include a hole transporting layer, a light emitting layer and an electron transporting layer. In this case, when a voltage is applied to the anode electrode 120 and the cathode electrode 140, holes and electrons move to the light emitting layer through the hole transport layer and the electron transport layer, respectively, and are combined with each other in the light emitting layer to emit light.

In one embodiment, the organic light emitting layer 130 may be a common layer commonly provided in the subpixels SP1, SP2, SP3 and SP4. In this case, the light emitting layer may be a white light emitting layer emitting white light.

In another embodiment, the organic light emitting layer 130 may be provided for each of the subpixels SP1, SP2, SP3 and SP4. For example, a red light emitting layer emitting red light may be provided in the first subpixel SP1, a white light emitting layer emitting white light may be provided in the second subpixel SP2, a blue light emitting layer emitting blue light may be provided in the third subpixel SP3, and a green light emitting layer emitting green light may be provided in the fourth subpixel SP4. In this case, the light emitting layer of the organic light emitting layer 130 is not provided in the transmissive area TA.

The cathode electrode 140 may be provided over the organic light emitting layer 130 and the bank 125. The cathode electrode 140 may be provided in the transmissive area TA as well as the non-transmissive area TA including the light emission areas EA1-1, EA1-2, EA2-1, EA2-2, EA3-1, EA3-2, EA4-1 and EA4-2, but is not limited thereto. The cathode electrode 140 may be provided only in the non-transmissive area NTA including the light emission areas EA1-1, EA1-2, EA2-1, EA2-2, EA3-1, EA3-2, EA4-1 and EA4-2, and may not be provided in the transmissive area TA to improve transmittance.

The cathode electrode 140 may be connected with the common power line VDDL through the cathode contact portion CCT. The cathode contact portion CCT may be connected with the common power line VDDL through the power connection line VCL. One end of the power connection line VCL may be connected with the common power line VDDL and the other end thereof may be connected with the cathode contact portion CCT.

The power connection line VCL may be protruded from the common power line VSSL and extended to the cathode contact portion CCT. As shown in FIGS. 6, 9 and 11, the cathode contact portion CCT may be disposed to overlap at least a portion of the bank 125.

The cathode contact portion CCT may be formed in a polygonal shape, and may have a minimum area for stable contact with the cathode electrode 140. The cathode contact portion CCT may be formed in the same layer as the source electrode SE and the drain electrode DE of the driving transistors TR1, TR2, TR3 and TR4. The cathode contact portion CT may be exposed by an undercut structure, and may be in contact with the area where the cathode electrode 140 is exposed. The undercut structure may be formed as an end of the upper layer provided over the lower layer is more protruded than the end of the lower layer.

In the display panel 110 according to another embodiment of the present disclosure, the planarization layer PLN and the passivation layer PAS may be provided over the cathode contact portion CCT. The planarization layer PLN and the passivation layer PAS may correspond to the lower layer of the undercut structure, and may expose at least a portion of the cathode contact portion CCT. The second bank pattern BP2 is an upper layer of an undercut structure, and its end may be more protruded than the planarization layer PLN and the passivation layer PAS to form the undercut structure.

The cathode electrode 140 may be connected to the cathode contact portion CCT exposed by the undercut structure as described above, and may be supplied with a second power source from the common power line VSSL through the cathode contact portion CCT.

The cathode electrode 140 may be a common layer that is commonly provided in the subpixels SP1, SP2, SP3 and SP4 to apply the same voltage. The cathode electrode 140 may be formed of a conductive material capable of transmitting light. For example, the cathode electrode 140 may be formed of a low resistance metal material such as silver (Ag), or an alloy of magnesium (Mg) and silver (Ag).

An encapsulation layer 150, a color filter CF and a black matrix BM may be provided over the light emitting elements. Since the encapsulation layer 150, the color filter CF and the black matrix BM are substantially the same as those shown in FIGS. 3 to 5, their description will be omitted.

According to the present disclosure, the following advantageous effects may be obtained.

In the present disclosure, the bank may be provided to cover or at least partially cover the anode contact hole and the end of at least one side of the anode electrode may be exposed to minimize the area of the bank. Therefore, the present disclosure may improve the aperture ratio.

In addition, since the inclination angle of the end of the anode electrode is equal to or less than 45°, deterioration of light emission efficiency, which is caused by the current concentrated on the end of the anode electrode, may be prevented from occurring.

It will be apparent to those skilled in the art that the present disclosure described above is not limited by the above-described embodiments and the accompanying drawings and that various substitutions, modifications and variations can be made in the present disclosure without departing from the spirit or scope of the disclosures. Consequently, the scope of the present disclosure is intended to cover all variations or modifications derived from the meaning, scope and equivalent concept of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device comprising:
    a substrate provided with transmissive areas and a plurality of subpixels disposed between the transmissive areas;
    a plurality of driving transistors provided in each of the plurality of subpixels;
    a plurality of anode electrodes provided in each of the plurality of subpixels and coupled with the driving transistor through an anode contact hole;
    a bank overlapped with at least a portion of the anode contact hole over the anode electrode;
    a light emitting layer provided over the anode electrodes and the bank; and
    a cathode electrode provided over the light emitting layer, wherein an end of at least one side of the anode electrode is exposed without being covered by the bank.

2. The display device of claim 1, wherein each of the plurality of subpixels includes a light emission area emitting light emitted from the light emitting layer to the outside, and at least one side of the light emission area is matched with an end of the anode electrode.

3. The display device of claim 1, wherein the bank at least partially covers one anode contact hole with one pattern.

4. The display device of claim 1, wherein the bank at least partially covers at least two anode contact holes provided in at least two of the plurality of subpixels with one pattern.

5. The display device of claim 4, wherein the plurality of subpixels include a first subpixel emitting light of a first color, a second subpixel emitting light of a second color, a third subpixel emitting light of a third color, and a fourth subpixel emitting light of a fourth color, and
    wherein the bank at least partially covers a first anode contact hole provided in the first subpixel, a second anode contact hole provided in the second subpixel, a third anode contact hole provided in the third subpixel, and a fourth anode contact hole provided in the fourth subpixel with one pattern.

6. The display device of claim 5, wherein the first and second subpixels are disposed to be adjacent to each other in a first direction, the third and fourth subpixels are disposed to be adjacent to each other in the first direction, one of the first and second subpixels is disposed to be adjacent to one of the third and fourth subpixels in a second direction, and the first to fourth anode contact holes are gathered in a middle area of a pixel.

7. The display device of claim 6, wherein the bank includes an island pattern covering the first to fourth anode contact holes.

8. The display device of claim 5, wherein the first to fourth subpixels are disposed in a line in a second direction, and the first to fourth anode contact holes are disposed in a line in the second direction.

9. The display device of claim 8, wherein the bank includes a first line pattern extended in the second direction to cover or at least partially cover the first to fourth anode contact holes.

10. The display device of claim 9, wherein the bank further includes a second line pattern extended in a first direction between the transmissive areas.

11. The display device of claim 1, wherein the anode electrode has an end that is exposed without being covered by the bank, and the end of the anode electrode has an inclination angle equal to or less than 45°.

12. The display device of claim 1, wherein the driving transistor includes an active layer, a gate electrode, a source electrode, and a drain electrode, and
    wherein the anode electrode is coupled to a source electrode or a drain electrode of the driving transistor through the anode contact hole.

* * * * *